US012075664B2

(12) United States Patent
Wang et al.

(10) Patent No.: US 12,075,664 B2
(45) Date of Patent: Aug. 27, 2024

(54) DISPLAY SUBSTRATE COMPRISING SILICON ORGANIC GLASS LAYER, DISPLAY APPARATUS, AND METHOD OF FABRICATING DISPLAY SUBSTRATE

(71) Applicant: BOE Technology Group Co., Ltd., Beijing (CN)

(72) Inventors: Guoying Wang, Beijing (CN); Yicheng Lin, Beijing (CN); Ling Wang, Beijing (CN); Zhen Song, Beijing (CN); Pan Xu, Beijing (CN); Xing Zhang, Beijing (CN); Ying Han, Beijing (CN); Zhan Gao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 959 days.

(21) Appl. No.: 16/971,673

(22) PCT Filed: Nov. 4, 2019

(86) PCT No.: PCT/CN2019/115340
§ 371 (c)(1),
(2) Date: Aug. 20, 2020

(87) PCT Pub. No.: WO2021/087667
PCT Pub. Date: May 14, 2021

(65) Prior Publication Data
US 2023/0147375 A1    May 11, 2023

(51) Int. Cl.
*H10K 59/13*    (2023.01)
*H10K 59/12*    (2023.01)
(Continued)

(52) U.S. Cl.
CPC ......... *H10K 59/13* (2023.02); *H10K 59/1213* (2023.02); *H10K 59/124* (2023.02);
(Continued)

(58) Field of Classification Search
CPC .............. H10K 59/13; H10K 59/131; H10K 59/1213; H10K 59/38; H10K 59/126; H10K 59/124; H10K 59/1201
See application file for complete search history.

(56) References Cited

U.S. PATENT DOCUMENTS

| 2002/0074551 A1* | 6/2002 | Kimura | H04N 1/028 438/149 |
|---|---|---|---|
| 2004/0085497 A1 | 5/2004 | Kawata | |

(Continued)

FOREIGN PATENT DOCUMENTS

| CN | 1470928 A | 1/2004 |
|---|---|---|
| CN | 103201843 A | 7/2013 |
| CN | 109155328 A | 1/2019 |
| JP | 2005010229 A * | 1/2005 |

OTHER PUBLICATIONS

International Search Report & Written Opinion mailed Jul. 27, 2020, regarding PCT/CN2019/115340.

*Primary Examiner* — Matthew E. Gordon
*Assistant Examiner* — Sean Ayers Winters
(74) *Attorney, Agent, or Firm* — Intellectual Valley Law, P.C.

(57) ABSTRACT

A display substrate having a plurality of subpixels is provided. A respective one of the plurality of subpixels includes a light emitting element; a first thin film transistor configured to driving light emission of the light emitting element; and a light emitting brightness value detector. The light emitting brightness value detector includes a second thin film transistor; and a photosensor electrically connected to the second thin film transistor and configured to detect a light emitting brightness value. The display substrate further includes a silicon organic glass layer on a side of at least one of the first thin film transistor or the second thin film transistor away from a base substrate; and the photosensor is (Continued)

on a side of the silicon organic glass layer away from the base substrate.

16 Claims, 11 Drawing Sheets

(51) Int. Cl.
  *H10K 59/121* (2023.01)
  *H10K 59/124* (2023.01)
  *H10K 59/126* (2023.01)
  *H10K 59/131* (2023.01)
  *H10K 59/38* (2023.01)

(52) U.S. Cl.
  CPC ......... *H10K 59/126* (2023.02); *H10K 59/131* (2023.02); *H10K 59/38* (2023.02); *H10K 59/1201* (2023.02)

(56) References Cited

U.S. PATENT DOCUMENTS

| | | | |
|---|---|---|---|
| 2014/0145179 A1 | 5/2014 | Yoon et al. | |
| 2014/0147966 A1 | 5/2014 | Chikama et al. | |
| 2015/0144984 A1* | 5/2015 | Chen | H01L 33/382 257/99 |
| 2015/0351168 A1* | 12/2015 | Yasumoto | H05B 33/04 428/448 |
| 2015/0379921 A1* | 12/2015 | Lee | H10K 50/824 345/82 |
| 2016/0380022 A1* | 12/2016 | Shu | H01L 27/14612 378/98.8 |
| 2017/0338248 A1 | 11/2017 | Park | |
| 2017/0373275 A1* | 12/2017 | Frantz | H10K 77/111 |
| 2021/0118970 A1* | 4/2021 | Song | H01L 25/18 |
| 2021/0351256 A1* | 11/2021 | Shu | H10K 59/13 |

* cited by examiner

DISPLAY SUBSTRATE COMPRISING SILICON ORGANIC GLASS LAYER, DISPLAY APPARATUS, AND METHOD OF FABRICATING DISPLAY SUBSTRATE

CROSS-REFERENCE TO RELATED APPLICATION

This application is a national stage application under 35 U.S.C. § 371 of International Application No. PCT/CN2019/115340, filed Nov. 4, 2019, the contents of which are incorporated by reference in the entirety.

TECHNICAL FIELD

The present invention relates to display technology, more particularly, to a display substrate, a display apparatus, and a method of fabricating a display substrate.

BACKGROUND

Organic light emitting diode (OLED) display apparatuses are self-emissive devices, and do not require backlights. OLED display apparatuses also provide more vivid colors and a larger color gamut as compared to the conventional liquid crystal display (LCD) apparatuses. Further, OLED display apparatuses can be made more flexible, thinner, and lighter than a typical LCD apparatuses. An OLED display apparatus typically includes an anode, an organic layer including a light emitting layer, and a cathode. OLEDs can be either a bottom-emission type OLED or a top-emission type OLED.

SUMMARY

In one aspect, the present invention provides a display substrate, comprising a plurality of subpixels; wherein a respective one of the plurality of subpixels comprises a light emitting element; a first thin film transistor configured to drive light emission of the light emitting element; and a light emitting brightness value detector; wherein the light emitting brightness value detector comprises a second thin film transistor; and a photosensor electrically connected to the second thin film transistor and configured to detect a light emitting brightness value; wherein the display substrate further comprises a silicon organic glass layer on a side of at least one of the first thin film transistor or the second thin film transistor away from a base substrate; and the photosensor is on a side of the silicon organic glass layer away from the base substrate.

Optionally, the display substrate further comprises a conductive protection layer on a side of the silicon organic glass layer away from the base substrate; wherein the photosensor is on a side of the conductive protection layer away from the silicon organic glass layer; an orthographic projection of the conductive protection layer on the base substrate covers an orthographic projection of at least a channel part of the first thin film transistor on the base substrate; and the orthographic projection of the conductive protection layer on the base substrate covers an orthographic projection of at least a channel part of the second thin film transistor on the base substrate.

Optionally, the conductive protection layer comprises a first conductive protection block and a second conductive protection block; an orthographic projection of the first conductive protection block on the base substrate covers the orthographic projection of at least a channel part of the first thin film transistor on the base substrate; and an orthographic projection of the second conductive protection block on the base substrate covers the orthographic projection of at least a channel part of the second thin film transistor on the base substrate.

Optionally, the conductive protection layer further comprises a first connecting electrode and a second connecting electrode respectively in a same layer as the first conductive protection block and the second conductive protection block; the first connecting electrode electrically connects a drain electrode of the first thin film transistor with the light emitting element; and the second connecting electrode electrically connects the photosensor with a source electrode of the second thin film transistor.

Optionally, an orthographic projection of the second connecting electrode on the base substrate covers an orthographic projection of the photosensor on the base substrate.

Optionally, the display substrate further comprises a first passivation layer between the silicon organic glass layer and the conductive protection layer; wherein the first connecting electrode extends through the first passivation layer and the silicon organic glass layer to connect to the drain electrode of the first thin film transistor; and the second connecting electrode extends through the first passivation layer and the silicon organic glass layer to connect to the source electrode of the second thin film transistor.

Optionally, the first conductive protection block extends through the first passivation layer and the silicon organic glass layer to connect to a gate electrode of the first thin film transistor; and the second conductive protection block extends through the first passivation layer and the silicon organic glass layer to connect to a gate electrode of the second thin film transistor.

Optionally, the display substrate further comprises a second passivation layer on a side of the photosensor and the conductive protection layer away from the base substrate; an insulating layer on a side of the second passivation layer away from the base substrate; and a first electrode of the light emitting element and a bias voltage signal line on a side of the insulating layer away from the base substrate; wherein the bias voltage signal line extends through the insulating layer and the second passivation layer to connect to a bias electrode; the bias electrode is electrically connected to the photosensor; and the first electrode of the light emitting element and the bias voltage signal line are in a same layer and are made of a same substantially transparent conductive material.

Optionally, an orthographic projection of a source electrode of the second thin film transistor on the base substrate covers an orthographic projection of the photosensor on the base substrate.

Optionally, the photosensor comprises a first polarity region connected to the bias electrode, a second polarity region connected to a source electrode of the first thin film transistor, and a diode junction connecting the first polarity region and the second polarity region; and at least the second polarity region comprises amorphous silicon.

Optionally, the display substrate further comprises a color filter in a subpixel region and between the light emitting element and the silicon organic glass layer.

Optionally, the display substrate further comprises a plurality of read lines; and a compensation circuit connected to the plurality of read lines, and configured to adjust light emitting brightness values of the plurality of subpixel areas to target brightness values; wherein a respective one of the plurality of read lines is configured to transmit signals detected by the light emitting brightness value detector.

In another aspect, the present invention provides a display apparatus, comprising the display substrate described herein or fabricated by a method described herein, and one or more integrated circuits connected to the display substrate.

In another aspect, the present invention provides a method of fabricating a display substrate, comprising forming a plurality of subpixels; wherein forming a respective one of the plurality of subpixels comprises forming a light emitting element; forming a first thin film transistor configured to driving light emission of the light emitting element; and forming a light emitting brightness value detector; wherein forming the light emitting brightness value detector comprises forming a second thin film transistor; and forming a photosensor electrically connected to the second thin film transistor and configured to detect a light emitting brightness value; wherein the method further comprises forming a silicon organic glass layer on a side of at least one of the first thin film transistor or the second thin film transistor away from a base substrate; and the photosensor is formed on a side of the silicon organic glass layer away from the base substrate.

Optionally, the method further comprises forming a conductive protection layer on a side of the silicon organic glass layer away from the base substrate; wherein the photosensor is formed on a side of the conductive protection layer away from the silicon organic glass layer; an orthographic projection of the conductive protection layer on the base substrate covers an orthographic projection of at least a channel part of the first thin film transistor on the base substrate; and the orthographic projection of the conductive protection layer on the base substrate covers an orthographic projection of at least a channel part of the second thin film transistor on the base substrate.

Optionally, forming the conductive protection layer comprises forming a first conductive protection block and forming a second conductive protection block; the first conductive protection block and the second conductive protection block are formed in a same layer in a same patterning process using a same conductive material and a same mask plate; an orthographic projection of the first conductive protection block on the base substrate covers the orthographic projection of at least a channel part of the first thin film transistor on the base substrate; and an orthographic projection of the second conductive protection block on the base substrate covers the orthographic projection of at least a channel part of the second thin film transistor on the base substrate.

Optionally, forming the conductive protection layer further comprises forming a first connecting electrode and forming a second connecting electrode; wherein the first connecting electrode, the second connecting electrode, the first conductive protection block, and the second conductive protection block are formed in a same layer in a same patterning process using a same conductive material and a same mask plate; the first connecting electrode electrically connects a drain electrode of the first thin film transistor with the light emitting element; and the second connecting electrode electrically connects the photosensor with a source electrode of the second thin film transistor.

Optionally, the method further comprises forming a first passivation layer on a side of the silicon organic glass layer away from the base substrate and on a side of the conductive protection layer closer to the base substrate; forming a first via extending through the first passivation layer and the silicon organic glass layer, wherein the first conductive protection block extends through the first via to connect to a gate electrode of the first thin film transistor; forming a second via extending through the first passivation layer and the silicon organic glass layer, wherein the second conductive protection block extends through the second via to connect to a gate electrode of the second thin film transistor; forming a third via extending through the first passivation layer and the silicon organic glass layer, wherein the first connecting electrode extends through the third via to connect to the drain electrode of the first thin film transistor; and forming a fourth via extending through the first passivation layer and the silicon organic glass layer, wherein the second connecting electrode extends through the fourth via to connect to the source electrode of the second thin film transistor.

Optionally, the method further comprises forming an insulating layer on aside of the photosensor and the conductive protection layer away from the base substrate; wherein subsequent to forming the photosensor and prior to forming the insulating layer, the method is absent of an etching step.

Optionally, forming the photosensor comprises a hydrogen bombardment treatment process.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
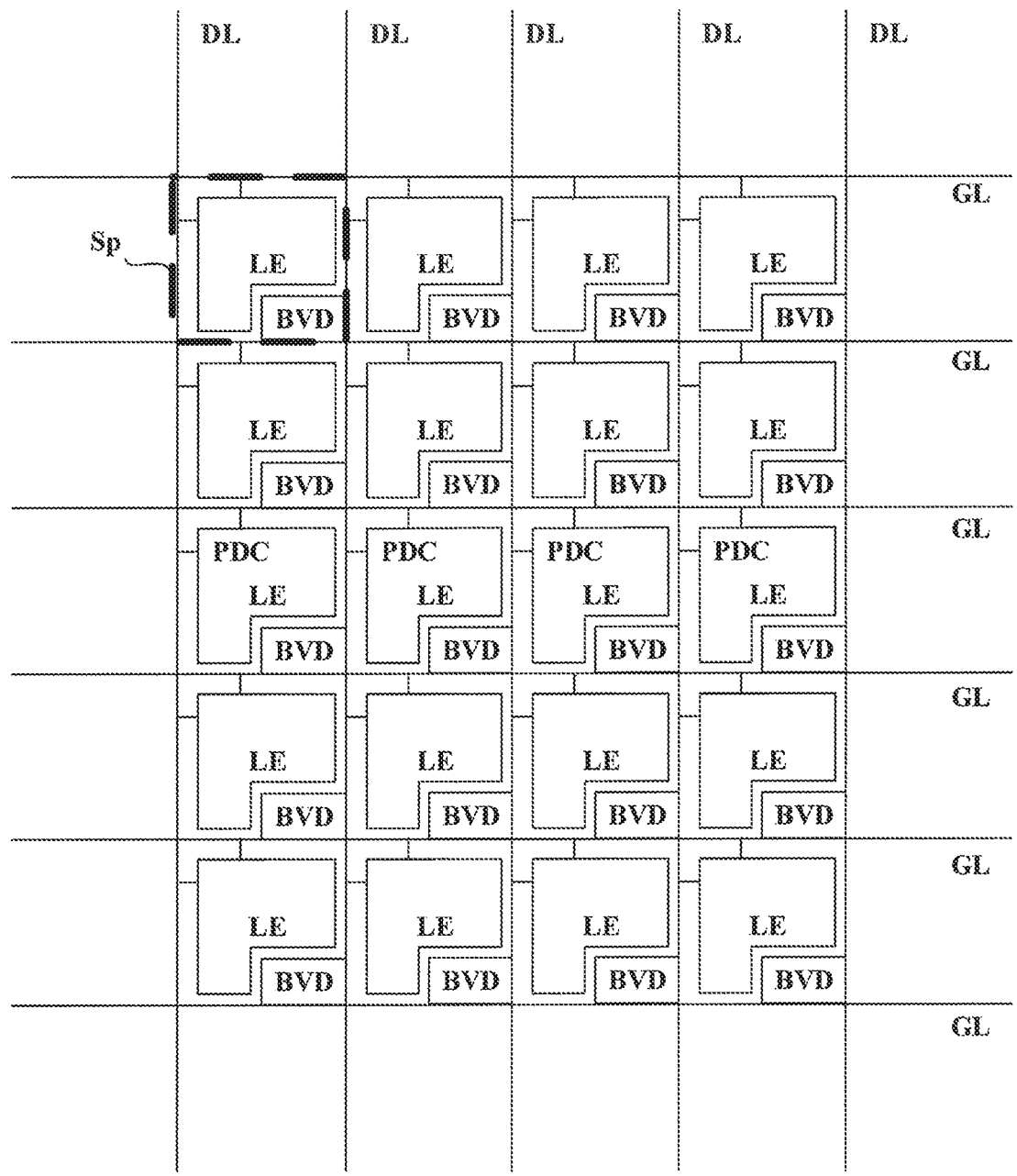
FIG. 1 is a schematic diagram illustrating the structure of a display substrate in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In an organic light emitting diode display apparatus, light emission intensity is affected by many factors. For example, drifting of the threshold voltage, a shift of driving current, as well as a change in the mobility rate of the thin film transistors, can affect the brightness of the display. The compensation of the light emission in the organic light emitting diode display apparatus can be achieved by either an internal compensation method or an external compensation method. To compensate light emission in the organic light emitting diode display apparatus, a photosensor is disposed in the display apparatus to detect the light emitting brightness value, and a thin film transistor is connected to the photosensor to control the detection of the photo-sensing signal. In fabricating the photosensor, a hydrogen bombardment treatment process is applied. The channel part of the active layer of the thin film transistor will be adversely affected by the hydrogen bombardment treatment, resulting in a negative shift of the threshold voltage of the thin film transistor, an increase in the dark current, and a decrease in the signal noise ratio. The problem is particularly severe when the thin film transistor is a back channel etch-type thin film transistor.

To avoid this problem, in some embodiments, the electrode material layer for forming the source electrode and the drain electrode of the thin film transistor is not patterned (etched) until the photosensor is formed, e.g., after the hydrogen bombardment treatment process is performed. However, etching the electrode material layer for forming the source electrode and the drain electrode subsequent to forming the photosensor inevitably leads to another issue, i.e., the etching of the electrode material layer would inadvertently damage a lateral side of the photosensor, which is proximal to the source electrode and the drain electrode to be formed. This adversely affects the performance of the photosensor, resulting in an increase in the dark current of the photosensor and a decrease in the signal noise ratio.

Accordingly, the present disclosure provides, inter alia, a display substrate, a display apparatus, and a method of fabricating a display substrate that substantially obviate one or more of the problems due to limitations and disadvantages of the related art. In one aspect, the present disclosure provides a display substrate. In some embodiments, the display substrate includes a plurality of subpixels. In some embodiments, a respective one of the plurality of subpixels includes a light emitting element; a first thin film transistor configured to driving light emission of the light emitting element; and a light emitting brightness value detector. Optionally, the light emitting brightness value detector includes a second thin film transistor; and a photosensor electrically connected to the second thin film transistor and configured to detect a light emitting brightness value. Optionally, the display substrate further includes a silicon organic glass layer on a side of at least one of the first thin film transistor or the second thin film transistor away from a base substrate. Optionally, the photosensor is on a side of the silicon organic glass layer away from the base substrate.

FIG. 1 is a schematic diagram illustrating the structure of a display substrate in some embodiments according to the present disclosure. Referring to FIG. 1, the display substrate in some embodiments includes a plurality of subpixels Sp defined by a plurality of gate lines GL and a plurality of data lines DL intersecting each other. A respective one of the plurality of subpixels Sp includes a light emitting element LE and a light emitting brightness value detector BVD.

Various appropriate light emitting elements may be used in the present display substrate. Examples of appropriate light emitting elements include an organic light emitting diode, a quantum dots light emitting diode, and a micro light emitting diode.

Figure 2:
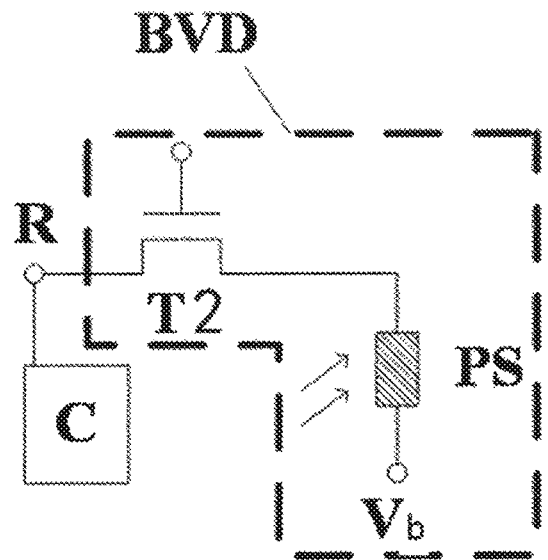
FIG. 2 is a circuit diagram of a light emitting brightness value detector in some embodiments according to the present disclosure.

FIG. 2 is a circuit diagram of a light emitting brightness value detector in some embodiments according to the present disclosure. Referring to FIG. 1 and FIG. 2, the light emitting brightness value detector BVD includes a second thin film transistor T2 and the photosensor PS electrically connected to each other. In some embodiments, a second source electrode S2 of the second thin film transistor T2 is electrically connected to the photosensor PS. A second drain electrode D2 of the second thin film transistors T2 is electrically connected to one of a plurality of read line R, which in turn is connected to a compensation circuit C. A respective one of the plurality of read lines R is configured to transmit signals detected by the light emitting brightness value detector BVD to the compensation circuit C. The compensation circuit C is electrically connected to the plurality of read lines R, and is configured to adjust light emitting brightness values of the plurality of subpixel Sp to the target brightness values. Vb in FIG. 2 stands for a bias voltage provided to a bias electrode, and in turn to a first polarity region of the photosensor PS. Referring to FIG. 1 and FIG. 2, the second drain electrode D2 of the second thin film transistor T2 is electrically connected to a respective one of the plurality of read lines R. When the second thin film transistor T2 is turned on, a photo-sensing signal is transmitted from the second source electrode S2 to the second drain electrode D2, and in turn to the respective one of the plurality of read lines R.

Various appropriate photosensors having a diode junction may be utilized in making and using the present display panel. Examples of photosensors having a diode junction include, but are not limited to, a PN photodiode, a PIN photodiode, an avalanche photodiode, a MIM diode junction, a MIS diode junction, a MOS diode junction, a SIS diode junction, and a MS diode junction.

Figure 3:
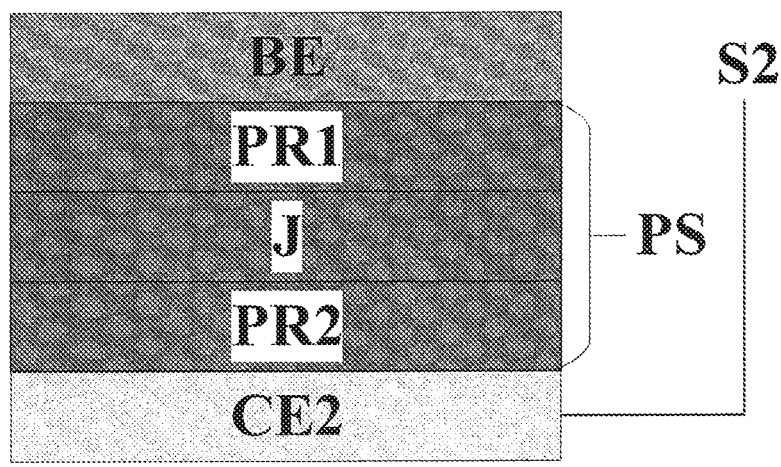
FIG. 3 illustrates the structure of a photosensor in some embodiments according to the present disclosure

FIG. 3 illustrates the structure of a photosensor in some embodiments according to the present disclosure. As shown in FIG. 3, the photosensor in some embodiments includes a first polarity region PR1 connected to a bias electrode BE, and a second polarity region PR2 connected to the second source electrode S2 of the second thin film transistors T2 through a second connecting electrode CE2, and a diode junction J connecting the first polarity region PR1 and the second polarity region PR2. As used herein, the term diode junction refers to a junction that can exhibit current rectification, e.g., a junction that exhibits drastically different conductivities in one bias direction relative to the other.

Optionally, the photosensor having a diode junction includes a first polarity region having a first dopant, a second polarity region having a second dopant, and a diode junction connecting the first polarity region and the second polarity region. Optionally, the photosensor having the diode junction is reversely biased when the first polarity region is connected to a low voltage and the second polarity region is connected to a high voltage. For example, the photosensor having the diode junction is in a reversely biased state when the first polarity region is connected to a bias electrode BE (low voltage, e.g., −5 V to 0 V) and the second polarity region is provided with a high voltage (e.g., 0 V or greater than 0 V). In some embodiments, the photosensor having the diode junction is a PN photodiode having a P+ doping semiconductor region as the first polarity region and an N+ doping semiconductor region as the second polarity region. In some embodiments, the photosensor having the diode junction is a PIN photodiode having a P+ doping semiconductor region as the first polarity region, an N+ doping semiconductor region as the second polarity region, and an intrinsic region of amorphous silicon between the P+ doping semiconductor region and the N+ doping semiconductor region. Optionally, at least the second polarity region includes amorphous silicon, e.g., a doped amorphous silicon.

Figure 4:
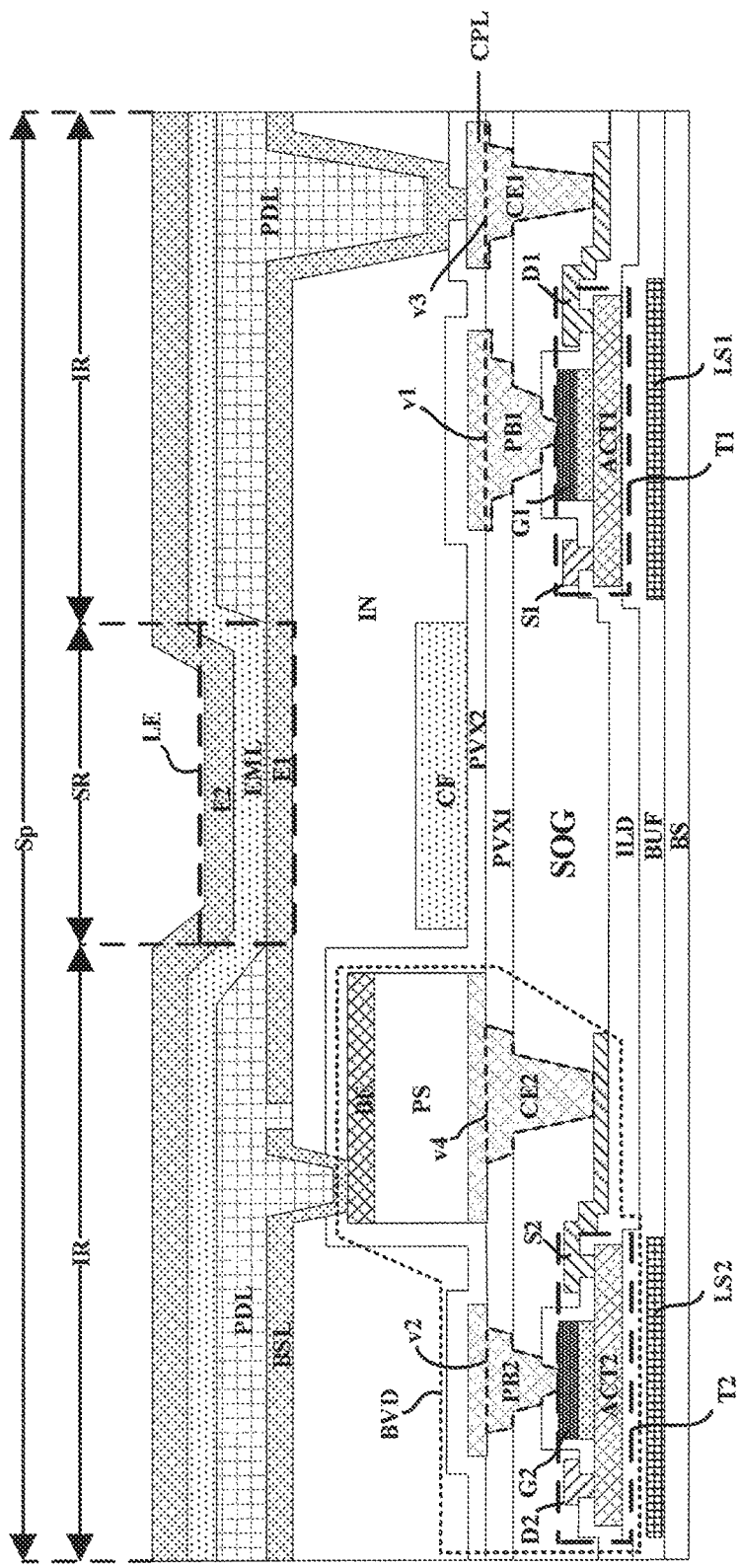
FIG. 4 is a schematic diagram illustrating the partial structure of a display substrate in some embodiments according to the present disclosure.

FIG. 4 is a schematic diagram illustrating the partial structure of a display substrate in some embodiments according to the present disclosure. Referring to FIG. 4, a respective one of the plurality of subpixels Sp of the display substrate is illustrated. The display substrate in some embodiments includes a base substrate BS; a light emitting element LE on the base substrate BS; a first thin film transistor T1 on the base substrate BS and configured to driving light emission of the light emitting element LE; and a light emitting brightness value detector BVD on the base substrate BS. The light emitting brightness value detector BVD is configured to detect a light emitting brightness value. The light emitting brightness value detector BVD includes a second thin film transistor T2; and a photosensor electrically connected to the second thin film transistor T2. The present display substrate in some embodiments further includes a silicon organic glass layer SOG on a side of at least one of the first thin film transistor T1 or the second thin film transistor T2 away from a base substrate BS. The photosensor PS is on a side of the silicon organic glass layer SOG away from the base substrate BS. The first thin film transistor T1 includes a first active layer ACT1, a first gate electrode G1, a first source electrode S1, and a first drain electrode D1. The second thin film transistor T2 includes a second active layer ACT2, a second gate electrode G2, a second source electrode S2, and a second drain electrode D2. The light emitting element LE includes a first electrode E1, a light emitting layer EML, and a second electrode E2, the light emitting layer EML between the first electrode E1 and the second electrode E2. The second drain electrode D2 of the second thin film transistor T2 is electrically connected to the first electrode E1 for providing a driving voltage to the first electrode E1.

By having a silicon organic glass layer SOG separating the thin film transistors of the display substrate from the layers of the photosensor, the thin film transistors are further protected from the hydrogen treatment during the fabrication of the layers of the photosensor. For example, the channel part of the active layer of the thin film transistor can be further protected from the hydrogen bombardment treatment during the fabrication of the layers of the photosensor. As a result, the properties and performance of the thin film transistor can be enhanced. For example, the dark current of the thin film transistor can be increased, and the signal to noise ratio during signal detection by the photosensor can be improved.

Moreover, the silicon organic glass layer SOG forms a planarized surface. Subsequently, when the photosensor is fabricated, the layers of the photosensor are formed on a relatively more planarized surface. Improved properties and performance of the photosensor can be achieved, for example, the dark current of the photosensor can be reduced, which leads to an enhanced light emission compensation accuracy.

In some embodiments, the display substrate further includes a conductive protection layer CPL on a side of the silicon organic glass layer SOG away from the base substrate BS. The photosensor PS is on a side of the conductive protection layer away CPL from the silicon organic glass layer SOG, e.g., the conductive protection layer CPL is between the silicon organic glass layer SOG and the photosensor PS.

In some embodiments, an orthographic projection of the conductive protection layer CPL on the base substrate BS covers an orthographic projection of at least a channel part of the first thin film transistor T1 on the base substrate BS. In some embodiments, the orthographic projection of the conductive protection layer CPL on the base substrate BS covers an orthographic projection of at least a channel part of the second thin film transistor T2 on the base substrate BS. By having a conductive protection layer CPL the thin film transistors can be further protected from the hydrogen treatment during the fabrication of the layers of the photosensor. For example, the channel part of the active layer of the thin film transistor can be further protected from the hydrogen bombardment treatment during the fabrication of the layers of the photosensor.

Optionally, the orthographic projection of the conductive protection layer CPL on the base substrate BS covers an orthographic projection of the first gate electrode G1 of the first thin film transistor T1 on the base substrate BS. Optionally, the orthographic projection of the conductive protection layer CPL on the base substrate BS at least partially overlaps with an orthographic projection of the first source electrode S1 and the first drain electrode D1 of the first thin film transistor T1 on the base substrate BS.

Optionally, the orthographic projection of the conductive protection layer CPL on the base substrate BS covers an orthographic projection of the second gate electrode G2 of the second thin film transistor T2 on the base substrate BS. Optionally, the orthographic projection of the conductive protection layer CPL on the base substrate BS at least partially overlaps with an orthographic projection of the second source electrode S2 and the second drain electrode D2 of the second thin film transistor T2 on the base substrate BS.

Figure 5:
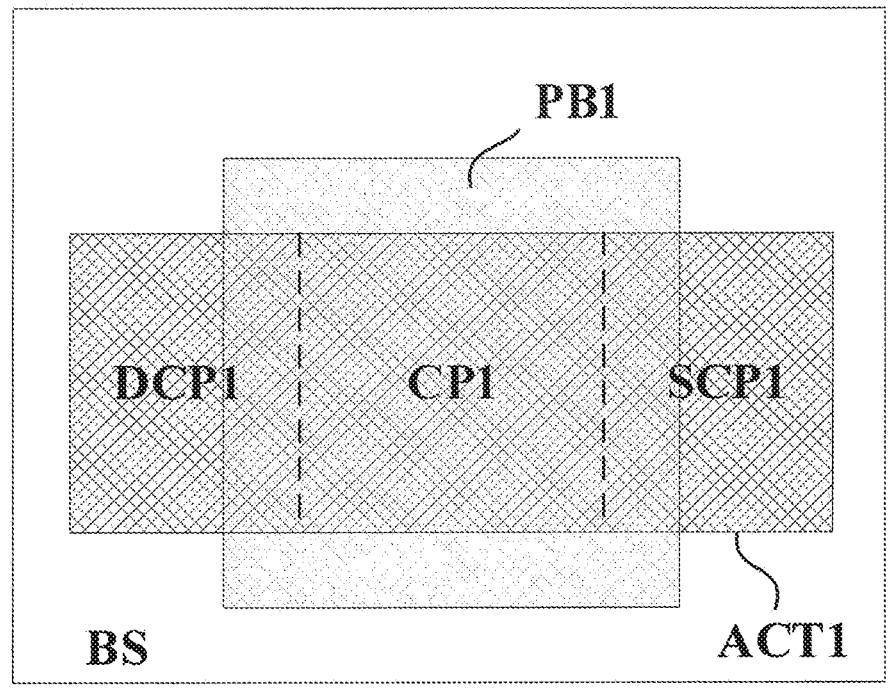
FIG. 5 is a plan view of a first conductive protection block and a first active layer in some embodiments according to the present disclosure.
Figure 6:
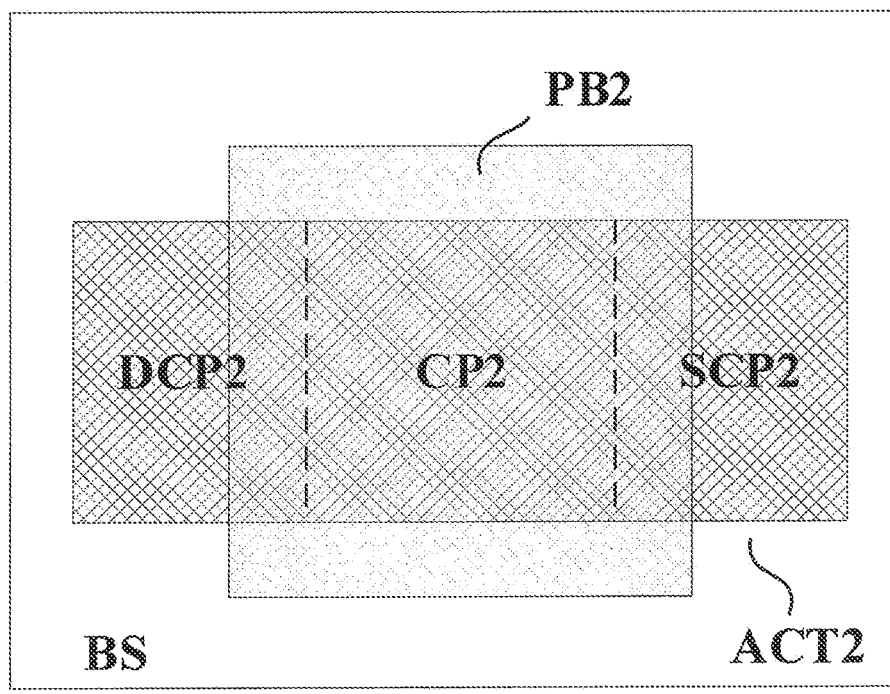
FIG. 6 is a plan view of a second conductive protection block and a second active layer in some embodiments according to the present disclosure.

In some embodiments, the conductive protection layer CPL includes a first conductive protection block PB1 and a second conductive protection block PB2. FIG. 5 is a plan view of a first conductive protection block and a first active layer in some embodiments according to the present disclosure. FIG. 6 is a plan view of a second conductive protection block and a second active layer in some embodiments according to the present disclosure. Referring to FIG. 5, in some embodiments, an orthographic projection of the first conductive protection block PB1 on the base substrate BS covers the orthographic projection of at least a channel part (CP1) of the first active layer ACT1 on the base substrate BS. Referring to FIG. 6, in some embodiments, an orthographic projection of the second conductive protection block PB2 on the base substrate BS covers the orthographic projection of at least a channel part (CP2) of the second active layer ACT2 on the base substrate BS.

Referring to FIG. 4, in some embodiments, the conductive protection layer CPL further includes a first connecting electrode CE1 and a second connecting electrode CE2 respectively in a same layer as the first conductive protection block PB1 and the second conductive protection block PB2. The first connecting electrode CE1 electrically connects a first drain electrode D1 of the first thin film transistor T1 with the light emitting element LE. The second connecting electrode CE2 electrically connects the photosensor PS with a second source electrode S2 of the second thin film transistor T2. As used herein, the term "same layer" refers to the relationship between the layers simultaneously formed in the same step. In one example, the first connecting electrode CE1, the second connecting electrode CE2, the first conductive protection block PB1, and the second conductive protection block PB2 are in a same layer when they are formed as a result of one or more steps of a same patterning process performed in a material deposited in a same deposition process. In another example, the first connecting electrode CE1, the second connecting electrode CE2, the first conductive protection block PB1, and the second conductive protection block PB2 can be formed in a same layer by simultaneously performing the step of forming the first connecting electrode CE1, the step of forming the second connecting electrode CE2, the step of forming the first conductive protection block PB1, and the step of forming the second conductive protection block PB2. The term "same layer" does not always mean that the thickness of the layer or the height of the layer in a cross-sectional view is the same.

The display substrate in FIG. 1 further includes a first light shielding layer LS1 between the first active layer ACT1 and the base substrate BS, and configured to shield light from irradiating on the first active layer ACT1. An orthographic projection of the first light shielding layer LS1 on the base substrate BS covers an orthographic projection of at least a channel part of the first thin film transistor T1 on the base substrate BS. Optionally, the orthographic projection of the first light shielding layer LS1 on the base substrate BS covers an orthographic projection of the first gate electrode G1 of the first thin film transistor T1 on the base substrate BS. Optionally, the orthographic projection of the first light shielding layer LS1 on the base substrate BS at least partially overlaps with an orthographic projection of the first source electrode S1 and the first drain electrode D1 of the first thin film transistor T1 on the base substrate BS.

The display substrate in FIG. 4 further includes a second light shielding layer LS2 between the second active layer ACT2 and the base substrate BS, and configured to shield light from irradiating on the second active layer ACT2. An orthographic projection of the second light shielding layer LS2 on the base substrate BS covers an orthographic projection of at least a channel part of the second thin film transistor T2 on the base substrate BS. Optionally, the orthographic projection of the second light shielding layer LS2 on the base substrate BS covers an orthographic projection of the second gate electrode G1 of the second thin film transistor T2 on the base substrate BS. Optionally, the orthographic projection of the second light shielding layer LS2 on the base substrate BS at least partially overlaps with an orthographic projection of the second source electrode S2 and the second drain electrode D2 of the second thin film transistor T2 on the base substrate BS.

Referring to FIG. 4, the display substrate in some embodiments further includes a buffer layer BUF on a side of the first light shielding layer LS1 and the second light shielding layer LS2 away from the base substrate BS, an inter-layer dielectric layer ILD on a side of the first active layer ACT1 of the first thin film transistor T1 and the second active layer ACT2 of the second thin film transistor T2 away from the buffer layer BUF. The silicon organic glass layer SOG is on a side of the first source electrode S1, the first drain electrode D1, the second source electrode S2, the second drain electrode D2, and the inter-layer dielectric layer ILD away from the base substrate BS. In some embodiments, the display substrate further includes a first passivation layer PVX1 away from the base substrate BS. Optionally, the conductive protection layer CPL is on a side of the first passivation layer PVX1 away from the base substrate BS.

In some embodiments, the display substrate further includes a first passivation layer PVX1 between the silicon organic glass layer SOG and the conductive protection layer CPL. Referring to FIG. 4, the first conductive protection block PB1 extends through the first passivation layer PVX1 and the silicon organic glass layer SOG to connect to a first gate electrode G1 of the first thin film transistor T1; the second conductive protection block PB2 extends through the first passivation layer PVX1 and the silicon organic glass layer SOG to connect to a second gate electrode G2 of the second thin film transistor T2; the first connecting electrode CE1 extends through the first passivation layer PVX1 and the silicon organic glass layer SOG to connect to the first drain electrode D1 of the first thin film transistor T1; and the second connecting electrode CE2 extends through the first passivation layer PVX1 and the silicon organic glass layer SOG to connect to the second source electrode S2 of the second thin film transistor T2.

In some embodiments, the display substrate includes a first via v1, a second via v2, a third via v3, and a fourth via v4 respectively extending through the first passivation layer PVX1 and the silicon organic glass layer SOG. Optionally, the first conductive protection block PB1 extends through the first via v1 to connect to the first gate electrode G1 of the first thin film transistor T1; the second conductive protection block PB2 extends through the second via v2 to connect to the second gate electrode G2 of the second thin film transistor T2; the first connecting electrode CE1 extends through the third via v3 to connect to the first drain electrode D1 of the first thin film transistor T1; and the second connecting electrode CE2 extends through the fourth via v4 to connect to the second source electrode S2 of the second thin film transistor T2.

Figure 7:
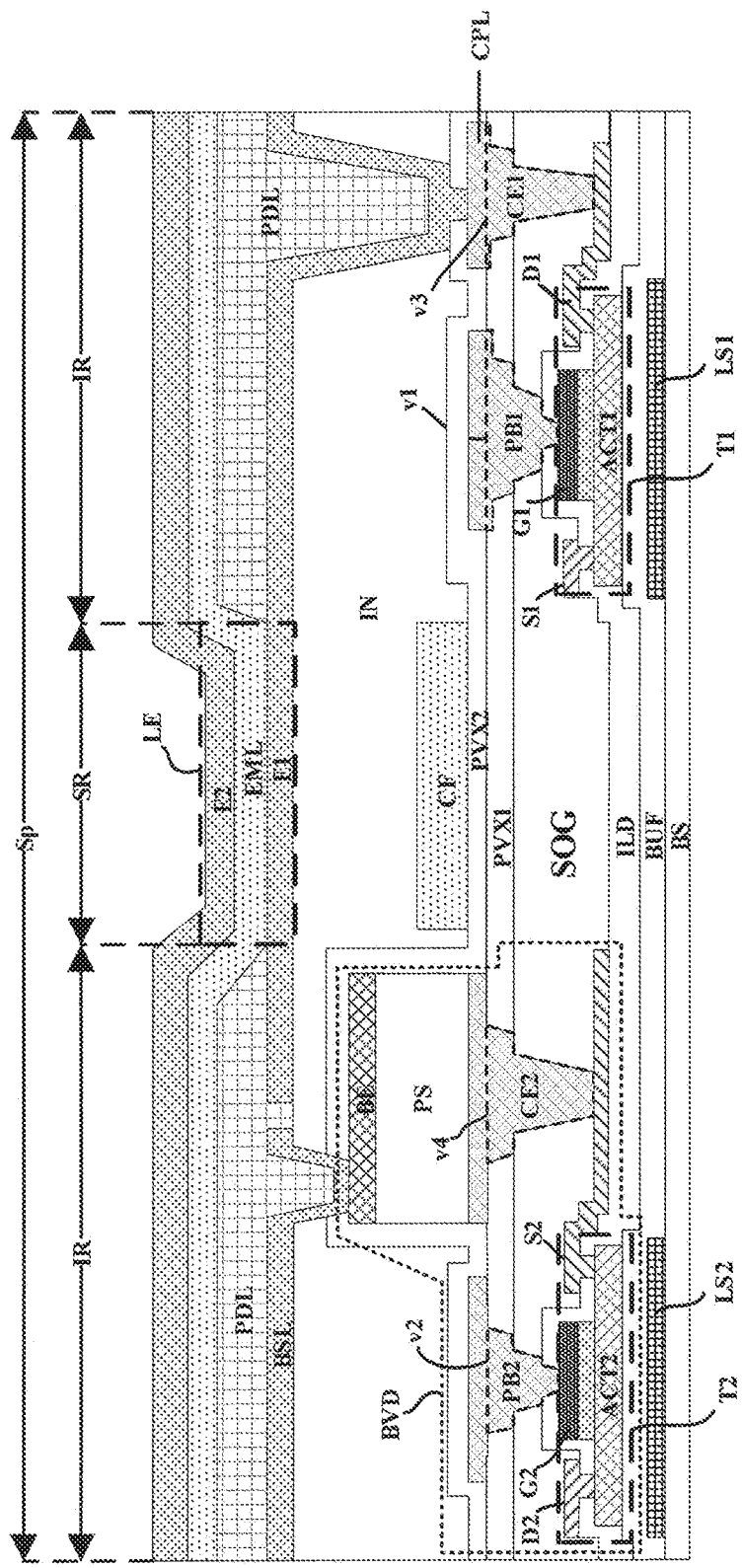
FIG. 7 is a schematic diagram illustrating the partial structure of a display substrate in some embodiments according to the present disclosure.
Figure 8:
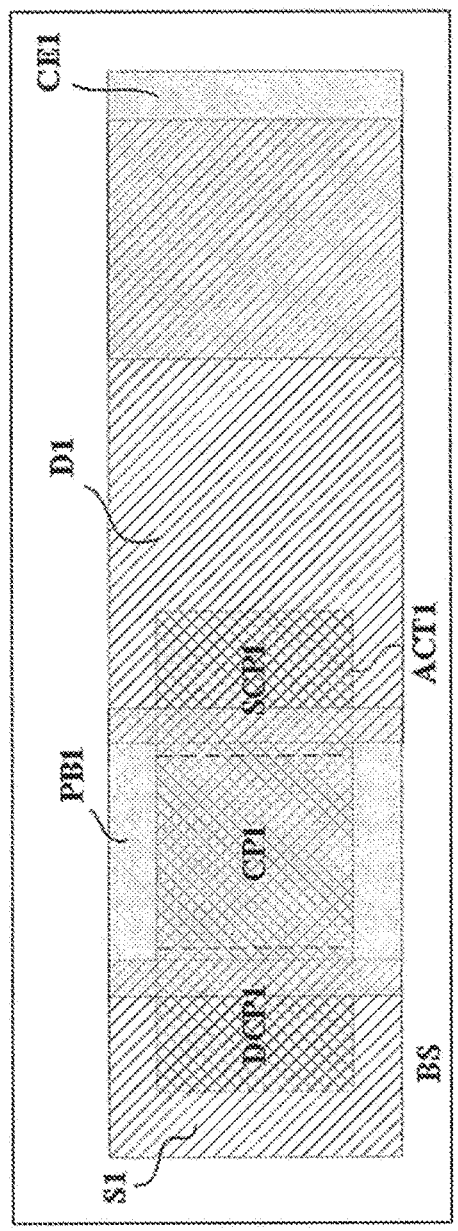
FIG. 8 is a plan view of a first conductive protection block, a first active layer, a first source electrode, a first drain electrode, and a first connecting electrode in some embodiments according to the present disclosure.

FIG. 7 is a schematic diagram illustrating the partial structure of a display substrate in some embodiments according to the present disclosure. FIG. 8 is a plan view of a first conductive protection block, a first active layer, a first source electrode, a first drain electrode, and a first connecting electrode in some embodiments according to the present disclosure. Referring to FIG. 7 and FIG. 8, in some embodiments, a combination of the orthographic projection of the first conductive protection block PB1, the orthographic projection of the first source electrode S1, and the orthographic projection of the first drain electrode D1 on the base substrate BS substantially covers the orthographic projection of the first active layer ACT1 on the base substrate BS. During the process of forming the photosensor, a hydrogen bombardment treatment is performed. The first conductive protection block PB1 effectively protects the channel part (CP1) of the first active layer ACT1 from the hydrogen bombardment treatment, avoiding adverse effects on the performance of the thin film transistor, e.g., a negative shift of the threshold voltage. A combination of the first conductive protection block PB1, the first source electrode S1, and the first drain electrode D1 effectively protects the entire active layer from the hydrogen bombardment treatment. Optionally, the first conductive protection block PB1 alone is sufficient to protect the first active layer ACT1 from the hydrogen bombardment treatment, e.g., the orthographic projection of the first conductive protection block PB1 on the base substrate BS substantially covers the orthographic projection of the first active layer ACT1 on the base substrate BS.

Figure 9:
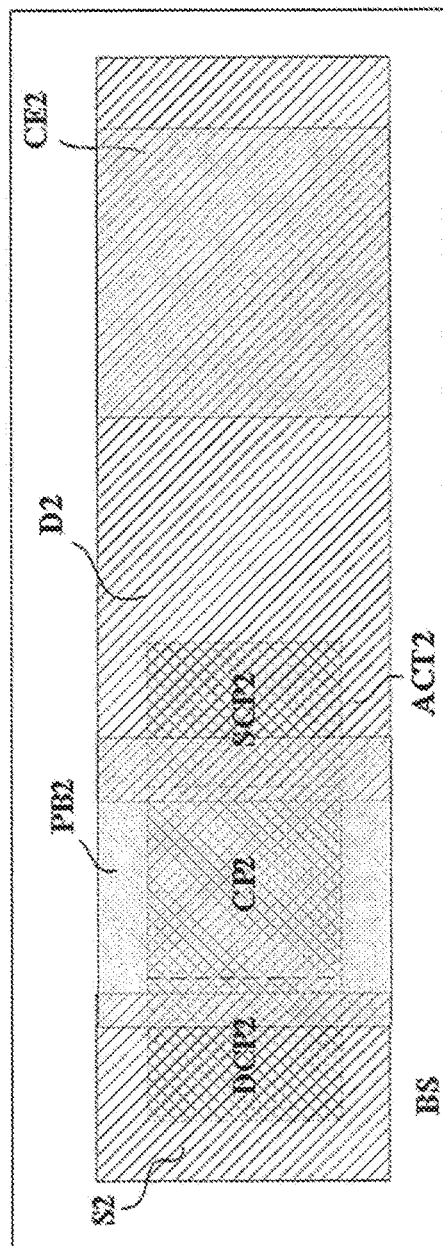
FIG. 9 is a plan view of a second conductive protection block, a second active layer, a second source electrode, a second drain electrode, and a second connecting electrode in some embodiments according to the present disclosure.

FIG. 9 is a plan view of a second conductive protection block, a second active layer, a second source electrode, a second drain electrode, and a second connecting electrode in some embodiments according to the present disclosure. Referring to FIG. 7 and FIG. 9, in some embodiments, an orthographic projection of the second connecting electrode CE2 on the base substrate BS covers an orthographic projection of the photosensor PS on the base substrate BS.

In some embodiments, the second source electrode S2 of the second thin film transistor T2 has an enlarged area, and extends into a region underneath the photosensor PS. As shown in FIG. 7 and FIG. 9, in some embodiments, an orthographic projection of a second source electrode S2 of the second thin film transistor T2 on the base substrate BS covers an orthographic projection of the photosensor PS on the base substrate BS. The second source electrode S2 further shield ambient light (from the outside of the base substrate BS) from irradiating on the photosensor PS. In this way, the photosensor PS is configured to accurately detect an actual light emitting brightness value from a light emitting element of the display substrate, substantially free of interference from the ambient light, thereby enhancing the accuracy of the detection of the light emitting brightness.

In some embodiments, a combination of the orthographic projection of the second conductive protection block PB2, the orthographic projection of the second drain electrode D2, and the orthographic projection of the second source electrode S2 on the base substrate BS substantially covers an orthographic projection of the second active layer ACT2 on the base substrate BS. Optionally, a combination of the orthographic projection of the second conductive protection block PB2 and the orthographic projection of the second source electrode S2 on the base substrate BS substantially covers an orthographic projection of the second active layer ACT2 on the base substrate BS. During the process of forming the photosensor, a hydrogen bombardment treatment is performed. The second conductive protection block PB2 effectively protects the channel part (CP2) of the second active layer ACT2 from the hydrogen bombardment treatment, avoiding adverse effects on the performance of the thin film transistor, e.g., a negative shift of the threshold voltage. A combination of the second conductive protection block PB2, the second drain electrode D2, and the second source electrode S2 effectively protects the entire active layer from the hydrogen bombardment treatment. Optionally, a combination of the second conductive protection block PB2 and the second source electrode S2 effectively protects the entire active layer from the hydrogen bombardment treatment. Optionally, a combination of the second conductive protection block PB2 and the second connecting electrode CE2 protects the entire active layer from the hydrogen bombardment treatment except for the gap between the second conductive protection block PB2 and the second connecting electrode CE2. Optionally, the second conductive protection block PB2 alone is sufficient to protect the second active layer ACT2 from the hydrogen bombardment treatment, e.g., the orthographic projection of the second conductive protection block PB2 on the base substrate BS substantially covers the orthographic projection of the second active layer ACT2 on the base substrate BS.

Figure 10:
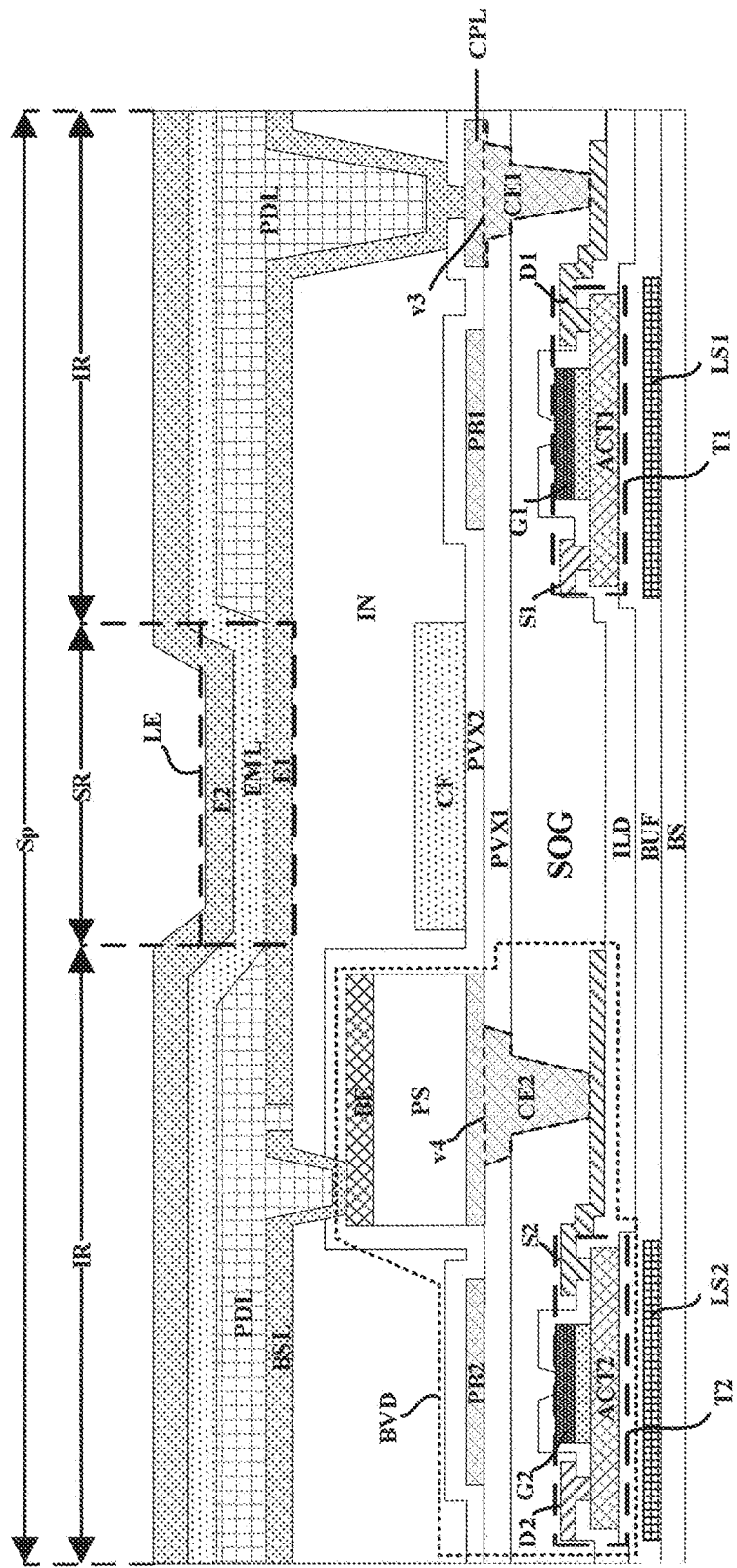
FIG. 10 is a schematic diagram illustrating the partial structure of a display substrate in some embodiments according to the present disclosure.

FIG. 10 is a schematic diagram illustrating the partial structure of a display substrate in some embodiments according to the present disclosure. Referring to FIG. 10, in some embodiments, either one of the first conductive protection block PB1 and the second conductive protection block PB2 is not electrically connected to any thin film transistors. Optionally, the first conductive protection block PB1 is insulated from the first gate electrode G1 of the first thin film transistor T1 by one or more insulating layers (e.g., the silicon organic glass layer SOG and the first passivation layer PVX1), and an orthographic projection of the first conductive protection block PB1 on the base substrate BS covers the orthographic projection of at least a channel part of the first thin film transistor T1 on the base substrate. Optionally, the second conductive protection block PB2 is insulated from the second gate electrode G2 of the second thin film transistor T2 by one or more insulating layers (e.g., the silicon organic glass layer SOG and the first passivation layer PVX1), and an orthographic projection of the second conductive protection block PB2 on the base substrate BS covers the orthographic projection of at least a channel part of the second thin film transistor T2 on the base substrate BS. Optionally, the first conductive protection block PB1 is a floating layer not connected to other electrodes of the display substrate. Optionally, the second conductive protection block PB2 is a floating layer not connected to other electrodes of the display substrate.

Comparing with the display substrate in FIG. 10, the display substrates in FIG. 4 and FIG. 7 provide particular advantages. In the display substrates exemplified in FIG. 4 and FIG. 7, the first conductive protection block PB1 is electrically connected to the first gate electrode G1 of the first thin film transistor T1, and/or the second conductive protection block PB2 is electrically connected to the second gate electrode G2 of the second thin film transistor T2. By having these unique features, effects of the parasitic capacitance induced by the conductive protection layer CPL on the photo-sensing signal detected by the photosensor PS can be reduced to a negligible level.

In some embodiments, and referring to FIG. 4, FIG. 7, and FIG. 10, the display substrate further includes a second passivation layer PVX2 on a side of the photosensor PS and the conductive protection layer CPL away from the base substrate BS. The second passivation layer PVX2 covers a lateral side of the photosensor PS. Optionally, the second passivation layer PVX2 is on a side of the bias electrode BE away from the photosensor PS. A bias voltage signal line BSL extends through the second passivation layer PVX2 to connect to the bias electrode BS.

In some embodiments, the display substrate further includes an insulating layer IN on a side of the second passivation layer PVX2 away from the base substrate BS. For example, the insulating layer IN may be a resin layer planarizing the display substrate.

In some embodiments, the display substrate further includes a first electrode E1 of the light emitting element LE and a bias voltage signal line BSL on a side of the insulating layer IN away from the base substrate BS. Optionally, the bias voltage signal line BSL extends through the insulating layer IN and the second passivation layer PVX2 to connect to a bias electrode BE, which is in turn connected to the photosensor PS.

In some embodiments, the first electrode E1 of the light emitting element LE and the bias voltage signal line BSL are in a same layer and made of same material. Optionally, the first electrode E1 of the light emitting element LE and the bias voltage signal line BSL are made of a substantially transparent conductive material such as indium tin oxide. As used herein, the term "substantially transparent" means at least 50 percent (e.g., at least 60 percent, at least 70 percent, at least 80 percent, at least 90 percent, and at least 95 percent) of an incident light in the visible wavelength range transmitted therethrough.

In some embodiments, the display substrate further includes a color filter CF in a subpixel region SR and between the light emitting element LE and the silicon organic glass layer SOG. The first thin film transistor T1 and the second thin film transistor T2 are disposed in an inter-subpixel region. As used herein, a subpixel region refers to a light emission region of a subpixel, such as a region corresponding to a pixel electrode in a liquid crystal display, a region corresponding to a light emissive layer in an organic light emitting diode display panel, or a region corresponding to the light transmission layer in the present disclosure. Optionally, a pixel may include a number of separate light emission regions corresponding to a number of subpixels in the pixel. Optionally, the subpixel region is a light emission region of a red color subpixel. Optionally, the subpixel region is a light emission region of a green color subpixel. Optionally, the subpixel region is a light emission region of a blue color subpixel. Optionally, the subpixel region is a light emission region of a white color subpixel. As used herein, an inter-subpixel region refers to a region between adjacent subpixel regions, such as a region corresponding to a black matrix in a liquid crystal display, a region corresponding a pixel definition layer in an organic light emitting diode display panel, or a black matrix in the present display panel. Optionally, the inter-subpixel region is a region between adjacent subpixel regions in a same pixel. Optionally, the inter-subpixel region is a region between two adjacent subpixel regions from two adjacent pixels. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally, the inter-subpixel region is a region between a subpixel region of a green color subpixel and a subpixel region of an adjacent blue color subpixel.

In some embodiments, the display substrate further includes a pixel definition layer PDL for defining a subpixel aperture. Optionally, the light emitting layer EML is disposed within the subpixel aperture.

The source electrodes and drain electrodes of the thin film transistors in some embodiments are in a same layer. For example, the first source electrode S1, the first drain electrode D1, the second source electrode S2, and the second drain electrode D2 are in a same layer and made of a same conductive material. In some embodiments, the first gate electrode G1 and the second gate electrode G2 are in a same layer and made of a same conductive material. In some embodiments, the first active layer ACT1 and the second active layer ACT2 are in a same layer and made of a same semiconductor material. In some embodiments, the first thin film transistor T1 and the second thin film transistor T2 are top gate thin film transistors. In some embodiments, the first thin film transistor T1 and the second thin film transistor T2 are bottom gate thin film transistors.

Figure 11:
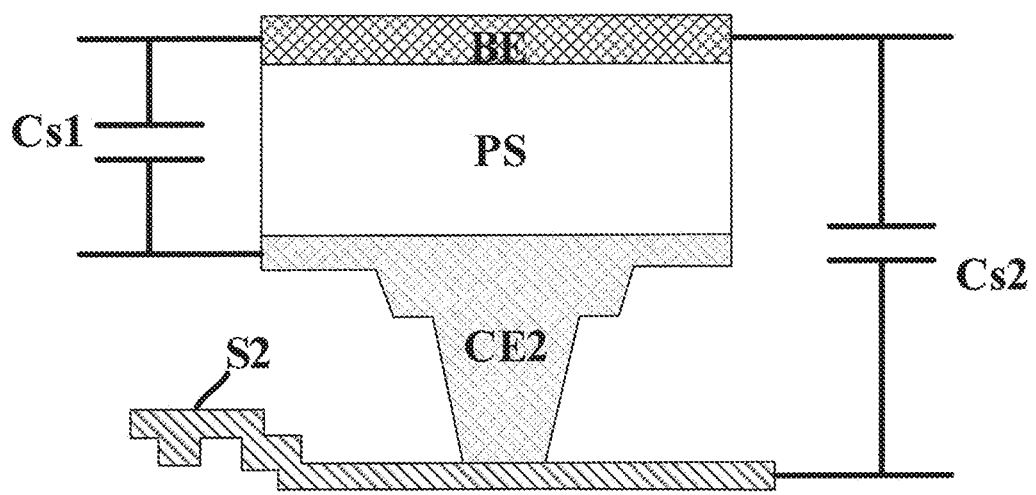
FIG. 11 is a circuit diagram illustrating a storage capacitance of a photosensor in some embodiments according to the present disclosure.

FIG. 11 is a circuit diagram illustrating a storage capacitance of a photosensor in some embodiments according to the present disclosure. Referring to FIG. 11, the storage capacitance of a photosensor PS includes capacitance Cs1 and Cs2 connected in parallel. The capacitance Cs1 is formed between the bias electrode BE and the second connecting electrode CE2, and the capacitance Cs2 is formed between the bias electrode BE and the second source electrode S2 of the second thin film transistor. By having a second connecting electrode CE2 in the display substrate, the effective storage capacitance of the photosensor PS can be increased.

In another aspect, the present disclosure provides a display panel including a display substrate described herein or fabricated by a method described herein. In some embodiments, the display panel is an organic light emitting diode display panel. In some embodiments, the display panel is a quantum dots light emitting diode display panel. In some embodiments, the display panel is a micro light emitting diode display panel.

In another aspect, the present disclosure provides a display apparatus including a display panel described herein, and one or more integrated circuits connected to the display substrate. Examples of appropriate display apparatuses include, but are not limited to, an electronic paper, a mobile phone, a tablet computer, a television, a monitor, a notebook computer, a digital album, a GPS, etc.

In another aspect, the present disclosure provides a method of fabricating a display substrate. In some embodiments, the method includes forming a plurality of subpixels. In some embodiments, the step of forming a respective one of the plurality of subpixels includes forming a light emitting element; forming a first thin film transistor configured to drive light emission of the light emitting element; and forming a light emitting brightness value detector. In some embodiments, the step of forming the light emitting brightness value detector includes forming a second thin film transistor; and forming a photosensor electrically connected to the second thin film transistor and configured to detect a light emitting brightness value. In some embodiments, the method further includes forming a silicon organic glass layer on a side of the first thin film transistor and the second thin film transistor away from a base substrate. Optionally, the photosensor is formed on a side of the silicon organic glass layer away from the base substrate.

In some embodiments, the method further includes forming a conductive protection layer on a side of the silicon organic glass layer away from the base substrate. Optionally, the photosensor is formed on a side of the conductive protection layer away from the silicon organic glass layer. Optionally, an orthographic projection of the conductive protection layer on the base substrate covers an orthographic projection of at least a channel part of the first thin film transistor on the base substrate. Optionally, the orthographic projection of the conductive protection layer on the base substrate covers an orthographic projection of at least a channel part of the second thin film transistor on the base substrate.

In some embodiments, the step of forming the conductive protection layer includes forming a first conductive protection block and forming a second conductive protection block. Optionally, the first conductive protection block and the second conductive protection block are formed in a same layer in a same patterning process using a same conductive material and a same mask plate. Optionally, an orthographic projection of the first conductive protection block on the base substrate covers the orthographic projection of at least a channel part of the first thin film transistor on the base substrate. Optionally, an orthographic projection of the second conductive protection block on the base substrate covers the orthographic projection of at least a channel part of the second thin film transistor on the base substrate.

In some embodiments, the step of forming the conductive protection layer further comprises forming a first connecting electrode and forming a second connecting electrode. Optionally, the first connecting electrode, the second connecting electrode, the first conductive protection block, and the second conductive protection block are formed in a same layer in a same patterning process using a same conductive material and a same mask plate. Optionally, the first connecting electrode electrically connects a drain electrode of the first thin film transistor with the light emitting element. Optionally, the second connecting electrode electrically connects the photosensor with a source electrode of the second thin film transistor.

In some embodiments, the method further includes forming a first passivation layer on a side of the silicon organic glass layer away from the base substrate and on a side of the conductive protection layer closer to the base substrate; forming a first via extending through the first passivation layer and the silicon organic glass layer, wherein the first conductive protection block extends through the first via to connect to a gate electrode of the first thin film transistor; forming a second via extending through the first passivation layer and the silicon organic glass layer, wherein the second conductive protection block extends through the second via to connect to a gate electrode of the second thin film transistor; forming a third via extending through the first passivation layer and the silicon organic glass layer, wherein the first connecting electrode extends through the third via to connect to the drain electrode of the first thin film transistor; and forming a fourth via extending through the first passivation layer and the silicon organic glass layer, wherein the second connecting electrode extends through the fourth via to connect to the source electrode of the second thin film transistor.

In some embodiments, the method further includes forming an insulating layer on a side of the photosensor and the conductive protection layer away from the base substrate. Subsequent to forming the photosensor and prior to forming the insulating layer, the method is absent of an etching step.

In some embodiments, the step of forming the photosensor includes a hydrogen bombardment treatment process. By having a conductive protection layer that covers the channel part of the first active layer of the first thin film transistor and/or the channel part of the second active layer of the second thin film transistor, adverse effects (e.g., a negative shift of the threshold voltage) on the performance of the thin film transistor due to the hydrogen bombardment treatment can be avoided. Optionally, a combination of the first conductive protection block, the first drain electrode, and the first source electrode effectively protects the entire active layer of the second thin film transistor from the hydrogen bombardment treatment. Optionally, a combination of the second conductive protection block, the second drain electrode, and the second source electrode effectively protects the entire active layer of the second thin film transistor from the hydrogen bombardment treatment. Optionally, a combination of the second conductive protection block and the second connecting electrode protects the entire active layer of the second thin film transistor from the hydrogen bombardment treatment except for the gap between the protection layer and the contact electrode. Optionally, the conductive protection layer alone is sufficient to protect the first active layer and/or the second active layer from the hydrogen bombardment treatment, e.g., the conductive protection layer is formed so that the orthographic projection of the conductive protection layer on the base substrate substantially covers the orthographic projection of the first active layer of the first thin film transistor and/or the second active layer of the second thin film transistor on the base substrate.

Figure 12A:
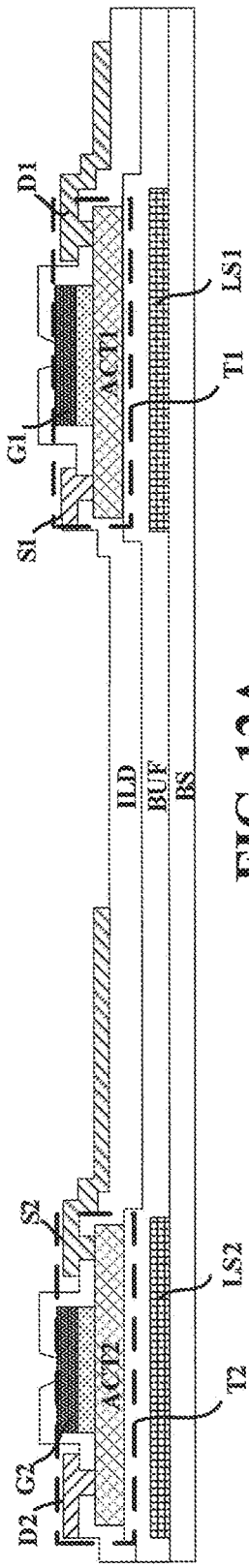
FIGS. 12A to 12H illustrate a method of fabricating a display substrate in some embodiments according to the present disclosure.

FIGS. 12A to 12H illustrate a method of fabricating a display substrate in some embodiments according to the present disclosure. Referring to FIG. 12A, a first light shielding block LS1 and a second light shielding block LS2 are formed on a base substrate BS. Various appropriate materials and various appropriate fabricating methods may be used for making the first light shielding block LS1 and the second light shielding block LS2. For example, a light shielding material may be deposited on the base substrate by vapor deposition (e.g., plasma-enhanced chemical vapor deposition), magnetron sputtering, or vacuum deposition. Examples of appropriate light shielding materials include, but are not limited to, metals (e.g., molybdenum, aluminum, titanium, gold, copper, hafnium, tantalum, chromium), alloys (e.g., AlNd, MoNb), black materials such as a carbon material, and so on.

A buffer layer BUF is formed on a side of the first light shielding block LS1 and the second light shielding block LS2 away from the base substrate BS. Various appropriate insulating materials and various appropriate fabricating methods may be used to make the buffer layer BUF. For example, an insulating material may be deposited on the base substrate by a plasma-enhanced chemical vapor deposition (PECVD) process and patterned. Examples of appropriate insulating materials for making the buffer layer BUF include, but are not limited to, silicon oxide ($SiO_x$), silicon nitride ($SiN_y$, e.g., $Si_3N_4$), silicon oxynitride ($SiO_xN_y$).

A first active layer ACT1, a second active layer ACT2, a first gate electrode G1, and a second gate electrode G2 are formed on a side of the buffer layer BUF away from the base substrate BS. Various appropriate semiconductor materials and various appropriate fabricating methods may be used to make the first active layer ACT1 and the second active layer ACT2. For example, a semiconductor material may be deposited on the base substrate by vapor deposition (e.g., plasma-enhanced chemical vapor deposition), magnetron sputtering, or vacuum deposition. Examples of appropriate semiconductor materials for making the first active layer ACT1 and the second active layer ACT2 include, but are not limited to, amorphous silicon, polycrystalline silicon, metal oxides such as indium tin oxide and indium gallium tin oxide. Optionally, the first active layer ACT1 and the second active layer ACT2 are made of a metal oxide such as indium gallium tin oxide.

An inter-layer dielectric layer ILD is formed on a side of the first gate electrode G1 and the second gate electrode G2 away from the base substrate BS. A first source electrode S1, a first drain electrode D1, a second source electrode S2, and a second drain electrode D2 are formed on a side of the inter-layer dielectric layer ILD away from the base substrate BS. The first source electrode S1 and the first drain electrode D1 are respectively connected to the first active layer ACT1 through vias extending through the inter-layer dielectric layer ILD. The second source electrode S2 and the second drain electrode D2 are respectively connected to the second active layer ACT2 through vias extending through the inter-layer dielectric layer ILD.

Various appropriate electrode materials and various appropriate fabricating methods may be used to make the first gate electrode G1, the second gate electrode G2, the first source electrode S1, the first drain electrode D1, the second source electrode S2, and the second drain electrode D2. For example, an electrode material may be deposited on the base substrate by vapor deposition (e.g., plasma-enhanced chemical vapor deposition), magnetron sputtering, or vacuum deposition. Examples of appropriate electrode materials for making the first gate electrode G1, the first source electrode S1, and the first drain electrode D1 include, but are not limited to, titanium, tantalum, aluminum, copper, molybdenum, chromium, and various alloys (MoNd/Cu/MoNd) or laminates thereof.

Figure 12B:
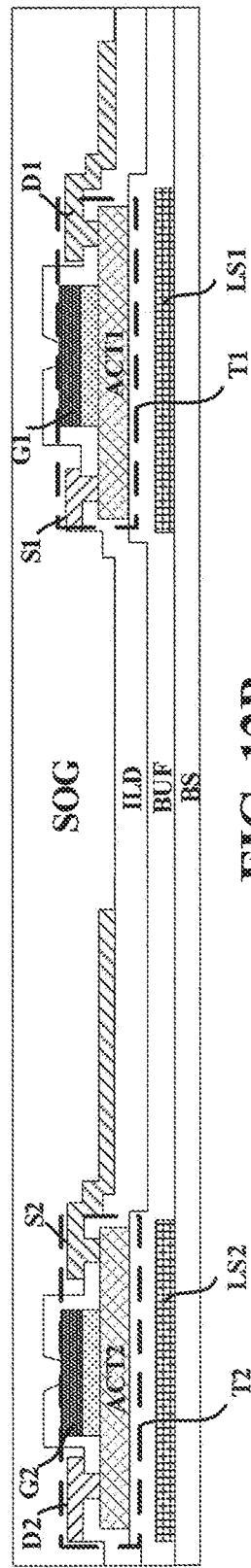

Referring to FIG. 12B, a silicon organic glass layer SOG is formed on a side of the first thin film transistor T1 and the second thin film transistor T2 away from a base substrate BS, e.g., on a side of the inter-layer dielectric layer ILD away from the base substrate BS.

Various appropriate silicone-based organic materials may be used for making the silicon organic glass layer SOG. Optionally, the silicon organic glass layer SOG is made of a silicone-based curable organic material (e.g., an ultraviolet curable composite). Optionally, the silicone-based organic material is a silicone-based resin material. Optionally, the silicon organic glass layer SOG is made of a silicone-based photocurable resin material. Examples of appropriate silicone-based organic materials include, but are not limited to, silsesquioxane or a linear polymeric silicone compound. Examples of silsesquioxanes include, but are not limited to, a cage silsesquioxane, a partial cage silsesquioxane, a ladder silsesquioxane, and a silsesquioxane having a random structure. Examples of linear polymeric silicone compounds include, but are not limited to, polysiloxane and polycarbosilane.

In some embodiments, the silicone-based organic material has a structure of formula I:

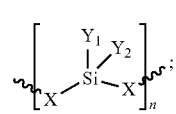

(I)

wherein n is a positive integer; X is oxygen or carbon. In some embodiments, each of $Y_1$ and $Y_2$ is selected from the group consisting of a hydrogen atom, an alkyl group, a hydroxyl group, an alkoxyl group, an aryl group, an acryloyl group, a glycidyl group, a vinyl group, a $-OR_1$ group, and a

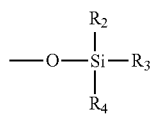

group; wherein R1 is selected from the group consisting of a hydrogen atom, an alkyl group, and an aryl group, each of $R_2$, $R_3$, and $R_4$ is selected from the group consisting of a hydrogen atom, a hydroxyl group, an alkyl group, an aryl group, an alkoxyl group, a halogen atom, an acryloyl group, a glycidyl group, a vinyl group, a phenyl group, and a trialkylsiloxy group. Optionally, n is in a range of 1 to 1000, e.g., 1 to 500, 1 to 200, 1 to 100, 1 to 50, or 1 to 20.

In some embodiments, one of $Y_1$ and $Y_2$ is a photosensitive functional group, and the other is selected from the group consisting of a hydrogen atom, an alkyl group, a hydroxyl group, an alkoxyl group, an aryl group, a $-OR_1$ group, and

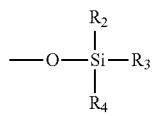

group. Optionally, $R_1$ is selected from the group consisting of a hydrogen atom, an alkyl group, and an aryl group, each of $R_2$, $R_3$, and $R_4$ is selected from the group consisting of a hydrogen atom, a hydroxyl group, an alkyl group, an aryl group, an alkoxyl group, a halogen atom, an acryloyl group, a glycidyl group, a vinyl group, a phenyl group, and a trialkylsiloxy group. In some embodiment, one of $Y_1$ and $Y_2$ is selected from the group consisting of a hydrogen atom, an alkyl group, a hydroxyl group, an alkoxyl group, an aryl group, a $-OR_1$, group, and a

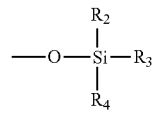

group; and the other is selected from the group consisting of an alkyl group, a hydroxyl group, an alkoxyl group, an aryl group, a $-OR_1$ group, and a

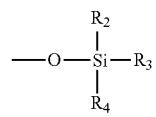

group, and further covalently modified by a photosensitive functional group. Optionally, R, is selected from the group consisting of a hydrogen atom, an alkyl group, and an aryl group, each of $R_2$, $R_3$, and $R_4$ is selected from the group consisting of a hydrogen atom, a hydroxyl group, an alkyl group, an aryl group, an alkoxyl group, a halogen atom, an acryloyl group, a glycidyl group, a vinyl group, a phenyl group, and a trialkylsiloxy group. Optionally, an unreacted photosensitive functional group is a functional group that renders the silicone-based organic material a negative photoresist. Optionally, an unreacted photosensitive functional group is a functional group that renders the silicone-based organic material a positive photoresist. Optionally, the photosensitive functional group is

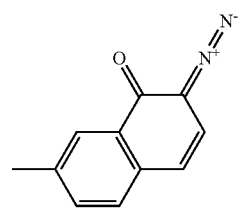

Optionally, the photosensitive functional group is

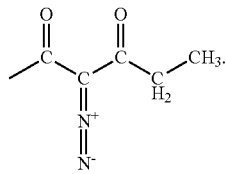

Optionally, the photosensitive functional group is a group having one or more epoxy groups. Optionally, the photosensitive functional group is a group having one or more polymerizable double bonds.

In some embodiments, the silicone-based organic material has a structure of formula II:

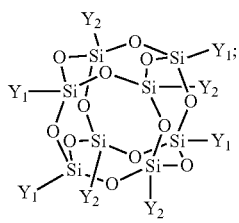
(II)

In some embodiments, each of $Y_1$ and $Y_2$ is selected from the group consisting of a hydrogen atom, an alkyl group, a hydroxyl group, an alkoxyl group, an aryl group, a —$OR_1$ group, and a

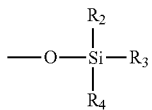

group; wherein $R_1$ is selected from the group consisting of a hydrogen atom, an alkyl group, and an aryl group, each of $R_2$, $R_3$, and $R_4$ is selected from the group consisting of a hydrogen atom, a hydroxyl group, an alkyl group, an aryl group, an alkoxyl group, a halogen atom, an acryloyl group, a glycidyl group, a vinyl group, a phenyl group, and a trialkylsiloxy group.

In some embodiments, one of $Y_1$ and $Y_2$ is a photosensitive functional group, and the other is selected from the group consisting of a hydrogen atom, an alkyl group, a hydroxyl group, an alkoxyl group, an aryl group, a —$OR_1$ group, and a

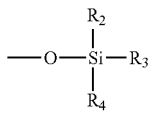

group. Optionally. $R_1$ is selected from the group consisting of a hydrogen atom, an alkyl group, and an aryl group, each of $R_2$, $R_3$, and $R_4$ is selected from the group consisting of a hydrogen atom, a hydroxyl group, an alkyl group, an aryl group, an alkoxyl group, a halogen atom, an acryloyl group, a glycidyl group, a vinyl group, a phenyl group, and a trialkylsiloxy group. In some embodiment, one of $Y_j$ and $Y_2$ is selected from the group consisting of a hydrogen atom, an alkyl group, a hydroxyl group, an alkoxyl group, an aryl group, a —$OR_1$ group, and a

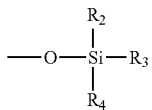

group; and the other is selected from the group consisting of an alkyl group, a hydroxyl group, an alkoxyl group, an aryl group, a —$OR_1$ group, and a

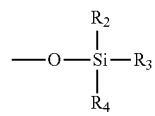

group, and further covalently modified by a photosensitive functional group. Optionally, $R_1$ is selected from the group consisting of a hydrogen atom, an alkyl group, and an aryl group, each of $R_2$, $R_3$, and $R_4$ is selected from the group consisting of a hydrogen atom, a hydroxyl group, an alkyl group, an aryl group, an alkoxyl group, a halogen atom, an acryloyl group, a glycidyl group, a vinyl group, a phenyl group, and a trialkylsiloxy group. Optionally, an unreacted photosensitive functional group is a functional group that renders the silicone-based organic material a negative photoresist. Optionally, an unreacted photosensitive functional group is a functional group that renders the silicone-based organic material a positive photoresist. Optionally, the photosensitive functional group is

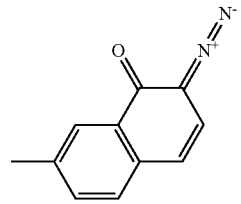

Optionally, the photosensitive functional group is

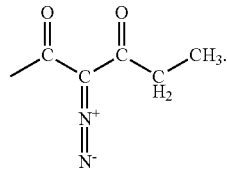

Optionally, the photosensitive functional group is a group having one or more epoxy groups. Optionally, the photosensitive functional group is a group having one or more polymerizable double bonds.

Figure 12C:
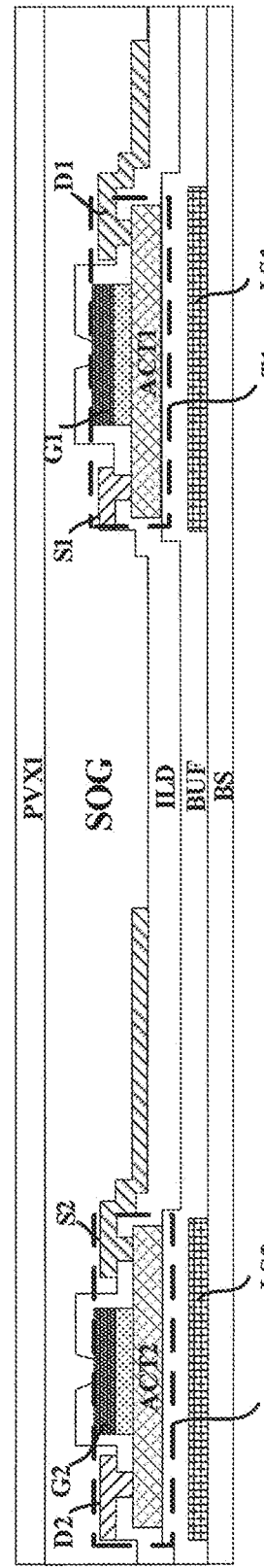

Referring to FIG. 12C, a first passivation layer PVX1 is formed on a side of the silicon organic glass layer SOG away from the base substrate BS. Various appropriate insulating materials and various appropriate fabricating methods may be used to make the inter-layer dielectric layer ILD and the first passivation layer PVX1. For example, an insulating material may be deposited on the base substrate by a plasma-enhanced chemical vapor deposition (PECVD) process and patterned. Examples of appropriate insulating materials for making the inter-layer dielectric layer ILD and the first passivation layer PVX1 include, but are not limited to, polyimide, resins, silicon oxide ($SiO_x$), silicon nitride ($SiN_y$, e.g., $Si_3N_4$), silicon oxynitride ($SiO_xN_y$).

Figure 12D:
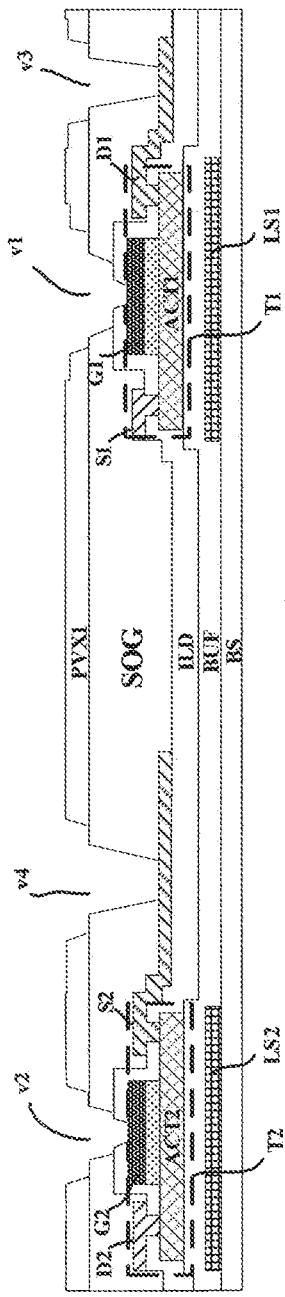

Referring to FIG. 12D, a first via v1 is formed to extend through the first passivation layer PVX1 and the silicon organic glass layer SOG, a second via v2 is formed to extend through the first passivation layer PVX1 and the silicon organic glass layer SOG, a third via v3 is formed to extend through the first passivation layer PVX1 and the silicon organic glass layer SOG, and a fourth via v4 is formed to extend through the first passivation layer PVX1 and the silicon organic glass layer SOG.

Figure 12E:
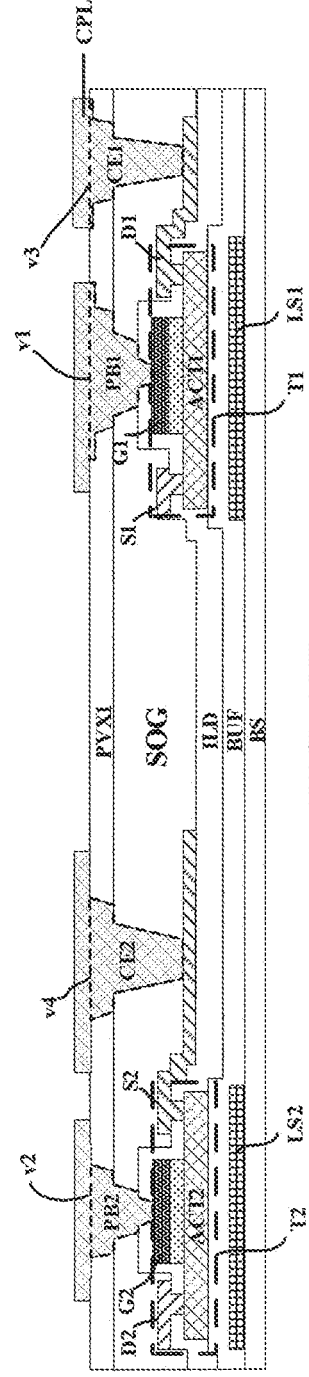

Referring to FIG. 12E, a conductive protection layer CPL is formed on a side of the first passivation layer PVX1 away from the base substrate BS. For example, a conductive material layer may be deposited on the first passivation layer PVX1, and the conductive material layer may be patterned to form a first conductive protection block PB1, a second conductive protection block PB2, a first connecting electrode CE1, and a second connecting electrode CE2. The first conductive protection block PB1, the second conductive protection block PB2, the first connecting electrode CE1, and the second connecting electrode CE2 are formed in a same layer in a same patterning process using a same conductive material and a same mask plate. The first conductive protection block PB1 extends through the first via v1 to connect to a first gate electrode G1 of the first thin film transistor T1. The second conductive protection block PB2 extends through the second via v2 to connect to a second gate electrode G2 of the second thin film transistor T2. The first connecting electrode CE1 extends through the third via v3 to connect to the first drain electrode D1 of the first thin film transistor T1. The second connecting electrode CE2 extends through the fourth via v4 to connect to the second source electrode S2 of the second thin film transistor T2.

Various appropriate electrode materials and various appropriate fabricating methods may be used to make the first conductive protection block PB1, the second conductive protection block PB2, the first connecting electrode CE1, and the second connecting electrode CE2. For example, an electrode material (e.g., a metallic electrode material) may be deposited on the base substrate by vapor deposition (e.g., plasma-enhanced chemical vapor deposition), magnetron sputtering, or vacuum deposition. Examples of appropriate electrode materials for making the first conductive protection block PB1, the second conductive protection block PB2, the first connecting electrode CE1, and the second connecting electrode CE2 include, but are not limited to, titanium, tantalum, aluminum, copper, molybdenum, chromium, and various alloys or laminates thereof. Optionally, a respective one of the first conductive protection block PB1, the second conductive protection block PB2, the first connecting electrode CE1, and the second connecting electrode CE2 is formed to have a single-layer structure. Optionally, a respective one of the first conductive protection block PB1, the second conductive protection block PB2, the first connecting electrode CE1, and the second connecting electrode CE2 is formed to have two or more sub-layers.

Figure 12F:
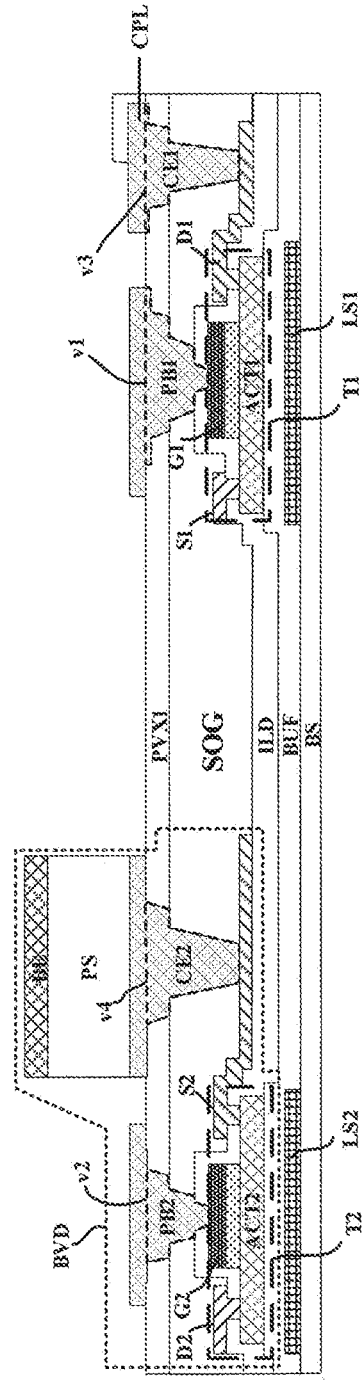

Referring to FIG. 12F, a photosensor PS is formed on a side of the second connecting electrode CE2 away from the base substrate BS, and a bias electrode BE is formed on a side of the photosensor PS away from the base substrate BS. The photosensor PS is formed to include a first polarity region connected to the bias electrode BE, a second polarity region connected to a second source electrode S2 of the second thin film transistors T2, and a diode junction connecting the first polarity region and the second polarity region.

In forming at least one layer of the photosensor PS, the method further includes treating the at least one layer of the photosensor PS using a hydrogen bombardment treatment process. In one example, at least the second polarity region is formed using amorphous silicon. Subsequent to forming an amorphous silicon material layer, either prior to or subsequent to patterning the amorphous silicon material layer, the amorphous silicon material layer is treated by the hydrogen bombardment treatment process. Because the conductive protection layer covers the channel part of the first active layer of the first thin film transistor and/or the channel part of the second active layer of the second thin film transistor, adverse effects (e.g., a negative shift of the threshold voltage) on the performance of the thin film transistor due to the hydrogen bombardment treatment can be avoided.

Various appropriate electrode materials and various appropriate fabricating methods may be used to make the bias electrode BE. For example, an electrode material may be deposited on the base substrate by vapor deposition (e.g., plasma-enhanced chemical vapor deposition), magnetron sputtering, or vacuum deposition. Examples of appropriate electrode materials for making the bias electrode BE include, but are not limited to, substantially transparent metal oxides such as indium tin oxide and indium zinc oxide.

Figure 12G:
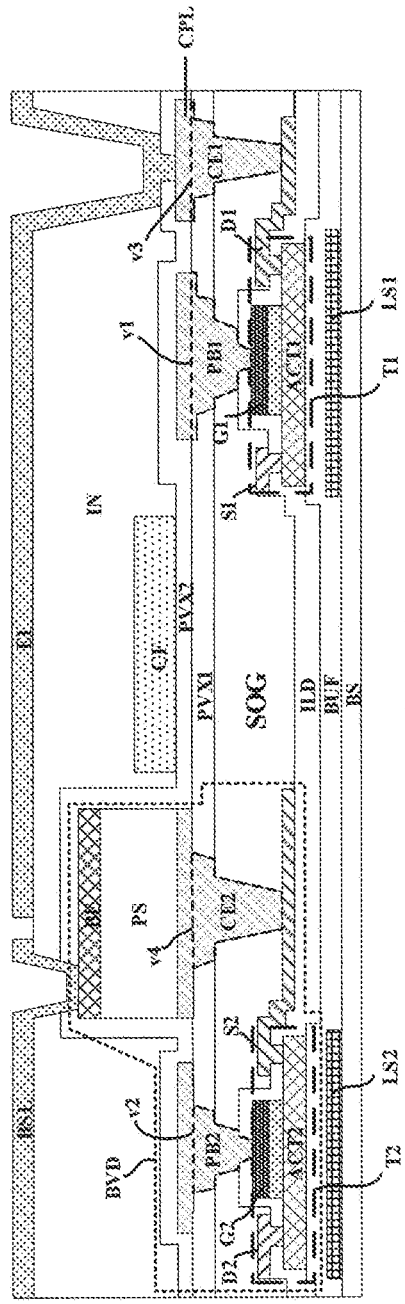

Referring to FIG. 12G, a second passivation layer PVX2 is formed on a side of the base substrate BS and the photosensor PS away from the base substrate BS, a color filter CF is formed on a side of the second passivation layer PVX2 away from the base substrate BS, an insulating layer IN is formed on a side of the second passivation layer PVX2 away from the base substrate BS, and a bias signal line BSL and a first electrode E1 are formed on a side of the insulating layer IN away from the base substrate BS. The bias signal line BSL and the first electrode E1 are formed in a same layer in a same patterning process using a same conductive material and a same mask plate. Various appropriate electrode materials and various appropriate fabricating methods may be used to make the bias signal line BSL and the first electrode E1. For example, an electrode material may be deposited on the base substrate by vapor deposition (e.g., plasma-enhanced chemical vapor deposition), magnetron sputtering, or vacuum deposition. Examples of appropriate electrode materials for making the bias signal line BSL and the first electrode E1 include, but are not limited to, substantially transparent metal oxides such as indium tin oxide and indium zinc oxide.

Various appropriate insulating materials and various appropriate fabricating methods may be used to make the insulating layer IN. For example, an insulating material may be deposited on the base substrate by a plasma-enhanced chemical vapor deposition (PECVD) process and patterned. Examples of appropriate insulating materials for making the insulating layer IN include, but are not limited to, polyimide, resins, silicon oxide ($SiO_x$), silicon nitride ($SiN_y$, e.g., $Si_3N_4$), silicon oxynitride ($SiO_xN_y$). In one example, the insulating layer IN is made of a resin material.

Various appropriate insulating materials and various appropriate fabricating methods may be used to make the second passivation layer PVX2. For example, an insulating material may be deposited on the substrate by a plasma-enhanced chemical vapor deposition (PECVD) process and patterned. Examples of appropriate insulating materials for making the second passivation layer PVX2 include, but are not limited to, polyimide, resins, silicon oxide ($SiO_x$), silicon nitride ($SiN_y$, e.g., $Si_3N_4$), silicon oxynitride ($SiO_xN_y$).

Figure 12H:
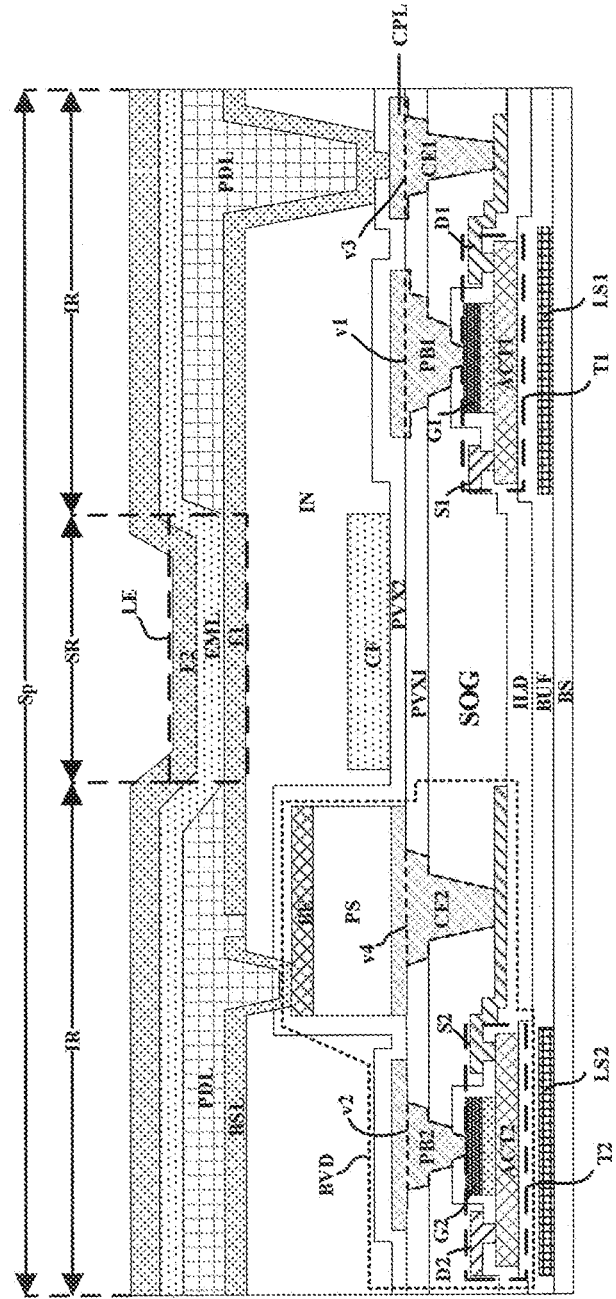

Referring to FIG. 12H, a pixel definition layer PDL is formed on a side of the bias signal line BSL and the first electrode E1 away from the base substrate BS to define a subpixel aperture. A light emitting layer EML (e.g., an organic light emitting layer) is formed on a side of the first electrode E1 away from the base substrate BS, and a second electrode E2 is formed on a side of the light emitting layer EML away from the base substrate BS, thereby forming a light emitting element LE.

Various appropriate insulating materials and various appropriate fabricating methods may be used to make the pixel definition layer PDL. For example, an insulating material may be deposited on the base substrate by a plasma-enhanced chemical vapor deposition (PECVD) process and patterned. Examples of appropriate insulating materials for making the pixel definition layer PDL include, but are not limited to, polyimide, resins, silicon oxide ($SiO_x$), silicon nitride ($SiN_y$, e.g., $Si_3N_4$), silicon oxynitride ($SiO_xN_y$).

Various appropriate electrode materials and various appropriate fabricating methods may be used to make the second electrode E2. For example, an electrode material may be deposited on the substrate by vapor deposition (e.g., plasma-enhanced chemical vapor deposition), magnetron sputtering, or vacuum deposition. Examples of appropriate electrode materials for making the bias signal line BSL and the second electrode E2 include, but are not limited to, substantially transparent metal oxides such as indium tin oxide and indium zinc oxide.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first". "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display substrate, comprising a plurality of subpixels; wherein a respective one of the plurality of subpixels comprises:
a light emitting element;
a first thin film transistor configured to drive light emission of the light emitting element; and
a light emitting brightness value detector;
wherein the light emitting brightness value detector comprises:
a second thin film transistor; and
a photosensor electrically connected to the second thin film transistor and configured to detect a light emitting brightness value;
wherein the display substrate further comprises a stacked structure;
the stacked structure comprises, sequentially,
a base substrate;
the first thin film transistor and the second thin film transistor stacked on the base substrate;
a silicon organic glass layer stacked on at least one of the first thin film transistor or the second thin film transistor;
a conductive protection layer stacked on the silicon organic glass layer; and
the photosensor stacked on the conductive protection layer;
wherein the conductive protection layer extends through the silicon organic glass layer;
the conductive protection layer comprises a first conductive protection block and a second conductive protection block:
an orthographic projection of the first conductive protection block on the base substrate covers the orthographic projection of at least a channel part of the first thin film transistor on the base substrate; and
an orthographic projection of the second conductive protection block on the base substrate covers the orthographic projection of at least a channel part of the second thin film transistor on the base substrate.

2. The display substrate of claim 1, wherein the conductive protection layer further comprises a first connecting electrode and a second connecting electrode respectively in a same layer as the first conductive protection block and the second conductive protection block;
the first connecting electrode electrically connects a drain electrode of the first thin film transistor with the light emitting element; and
the second connecting electrode electrically connects the photosensor with a source electrode of the second thin film transistor.

3. The display substrate of claim 1, wherein an orthographic projection of the second connecting electrode on the base substrate covers an orthographic projection of the photosensor on the base substrate.

4. The display substrate of claim 1, further comprising a first passivation layer between the silicon organic glass layer and the conductive protection layer;
wherein the first connecting electrode extends through the first passivation layer and the silicon organic glass layer to connect to the drain electrode of the first thin film transistor; and
the second connecting electrode extends through the first passivation layer and the silicon organic glass layer to connect to the source electrode of the second thin film transistor.

5. The display substrate of claim 4, wherein the first conductive protection block extends through the first passivation layer and the silicon organic glass layer to connect to a gate electrode of the first thin film transistor; and
the second conductive protection block extends through the first passivation layer and the silicon organic glass layer to connect to a gate electrode of the second thin film transistor.

6. The display substrate of claim 1, further comprising a second passivation layer on a side of the photosensor and the conductive protection layer away from the base substrate;

an insulating layer on a side of the second passivation layer away from the base substrate; and a first electrode of the light emitting element and a bias voltage signal line on a side of the insulating layer away from the base substrate;

wherein the bias voltage signal line extends through the insulating layer and the second passivation layer to connect to a bias electrode;

the bias electrode is electrically connected to the photosensor; and the first electrode of the light emitting element and the bias voltage signal line are in a same layer and are made of a same substantially transparent conductive material.

7. The display substrate of claim 1, wherein an orthographic projection of a source electrode of the second thin film transistor on the base substrate covers an orthographic projection of the photosensor on the base substrate.

8. The display substrate of claim 1, wherein the photosensor comprises a first polarity region connected to a bias electrode, a second polarity region connected to a source electrode of the first thin film transistor, and a diode junction connecting the first polarity region and the second polarity region; and at least the second polarity region comprises amorphous silicon.

9. The display substrate of claim 1, further comprising a color filter in a subpixel region and between the light emitting element and the silicon organic glass layer.

10. The display substrate of claim 1, further comprising a plurality of read lines; and a compensation circuit connected to the plurality of read lines, and configured to adjust light emitting brightness values of the plurality of subpixel areas to target brightness values;

wherein a respective one of the plurality of read lines is configured to transmit signals detected by the light emitting brightness value detector.

11. A display apparatus, comprising the display substrate of claim 1, and one or more integrated circuits connected to the display substrate.

12. A method of fabricating a display substrate, comprising forming a plurality of subpixels;

wherein forming a respective one of the plurality of subpixels comprises:

forming a light emitting element;

forming a first thin film transistor configured to driving light emission of the light emitting element; and forming a light emitting brightness value detector;

wherein forming the light emitting brightness value detector comprises:

forming a second thin film transistor; and forming a photosensor electrically connected to the second thin film transistor and configured to detect a light emitting brightness value;

wherein the method comprises forming a stacked structure;

forming the stacked structure comprises, sequentially, forming the first thin film transistor and the second thin film transistor stacked on a base substrate;

forming a silicon organic glass layer stacked on at least one of the first thin film transistor or the second thin film transistor;

forming the conductive protection layer stacked on the silicon organic glass layer; and forming the photosensor stacked on the conductive protection layer;

wherein the conductive protection layer extends through the silicon organic glass layer;

wherein forming the conductive protection layer comprises forming a first conductive protection block and forming a second conductive protection block;

the first conductive protection block and the second conductive protection block are formed in a same layer in a same patterning process using a same conductive material and a same mask plate;

an orthographic projection of the first conductive protection block on the base substrate covers the orthographic projection of at least a channel part of the first thin film transistor on the base substrate; and an orthographic projection of the second conductive protection block on the base substrate covers the orthographic projection of at least a channel part of the second thin film transistor on the base substrate.

13. The method of claim 12, wherein forming the conductive protection layer further comprises forming a first connecting electrode and forming a second connecting electrode;

wherein the first connecting electrode, the second connecting electrode, the first conductive protection block, and the second conductive protection block are formed in a same layer in a same patterning process using a same conductive material and a same mask plate;

the first connecting electrode electrically connects a drain electrode of the first thin film transistor with the light emitting element; and the second connecting electrode electrically connects the photosensor with a source electrode of the second thin film transistor.

14. The method of claim 12, further comprising forming a first passivation layer on a side of the silicon organic glass layer away from the base substrate and on a side of the conductive protection layer closer to the base substrate;

forming a first via extending through the first passivation layer and the silicon organic glass layer, wherein the first conductive protection block extends through the first via to connect to a gate electrode of the first thin film transistor;

forming a second via extending through the first passivation layer and the silicon organic glass layer, wherein the second conductive protection block extends through the second via to connect to a gate electrode of the second thin film transistor;

forming a third via extending through the first passivation layer and the silicon organic glass layer, wherein the first connecting electrode extends through the third via to connect to the drain electrode of the first thin film transistor; and forming a fourth via extending through the first passivation layer and the silicon organic glass layer, wherein the second connecting electrode extends through the fourth via to connect to the source electrode of the second thin film transistor.

15. The method of claim 12, further comprising forming an insulating layer on a side of the photosensor and the conductive protection layer away from the base substrate;

wherein subsequent to forming the photosensor and prior to forming the insulating layer, the method is absent of an etching step.

16. The method of claim 12, wherein forming the photosensor comprises a hydrogen bombardment treatment process.

* * * * *